(12) United States Patent
Woods et al.

(10) Patent No.: US 8,207,442 B2
(45) Date of Patent: Jun. 26, 2012

(54) REINFORCING STRUCTURES FOR THIN-FILM PHOTOVOLTAIC DEVICE SUBSTRATES, AND ASSOCIATED METHODS

(75) Inventors: Lawrence M. Woods, Littleton, CO (US); Joseph H. Armstrong, Littleton, CO (US); Rosine M. Ribelin, Lakewood, CO (US); Thomas Duncan Barnard, Murrieta, CA (US); Yukinari Harimoto, Kanagawa (JP); Hidekatsu Hatanaka, Chiba (JP); Maki Itoh, Tokyo (JP); Dimitris Elias Katsoulis, Midland, MI (US); Michitaka Suto, Kanagawa (JP); Bizhong Zhu, Midland, MI (US); Nicole R. Anderson, Midland, MI (US); Herschel Henry Reese, Midland, MI (US)

(73) Assignee: ITN Energy Systems, Inc., Littleton, CO (US)

( * ) Notice: Subject to any disclaimer, the term of this patent is extended or adjusted under 35 U.S.C. 154(b) by 754 days.

(21) Appl. No.: 11/737,119

(22) Filed: Apr. 18, 2007

(65) Prior Publication Data
US 2008/0115827 A1 May 22, 2008

Related U.S. Application Data

(60) Provisional application No. 60/792,852, filed on Apr. 18, 2006, provisional application No. 60/792,871, filed on Apr. 18, 2006, provisional application No. 60/792,770, filed on Apr. 18, 2006.

(51) Int. Cl.
*H01L 31/00* (2006.01)
(52) U.S. Cl. ........................................... 136/255
(58) Field of Classification Search ................. None
See application file for complete search history.

(56) References Cited

U.S. PATENT DOCUMENTS

| | | | |
|---|---|---|---|
| 3,419,593 A | 12/1968 | Willing et al. |
| 4,081,819 A | 3/1978 | Wong |
| 4,087,585 A | 5/1978 | Schulz |
| 4,260,780 A | 4/1981 | West |

(Continued)

FOREIGN PATENT DOCUMENTS

EP 0078541 5/1983

(Continued)

OTHER PUBLICATIONS

PCT/US2007/066902, International Search Report mailed May 26, 2008, 3 pages.

(Continued)

*Primary Examiner* — Jessica L Ward
*Assistant Examiner* — Steven Ha
(74) *Attorney, Agent, or Firm* — Lathrop & Gage LLP

(57) ABSTRACT

In an embodiment, one reinforced substrate for use in a photovoltaic device includes a polymer base material and a reinforcing structure bonded with the base material. The reinforced substrate presents a surface in a condition that is made-ready for deposition of thin film layers of the photovoltaic device. A thin film photovoltaic device includes the reinforced substrate, a back contact layer formed on the surface of the reinforced substrate, and a solar absorber layer formed on the back contact layer. A plurality of thin film photovoltaic devices may be formed on a common reinforced substrate. A process of producing a reinforced substrate includes combining a fluid base material and a fiber reinforcing structure to form an impregnated fiber reinforcement. The impregnated fiber reinforcement is cured to form the reinforced substrate, and the reinforced substrate is annealed.

27 Claims, 7 Drawing Sheets

U.S. PATENT DOCUMENTS

| | | | |
|---|---|---|---|
| 4,276,424 A | 6/1981 | Peterson, Jr. et al. | |
| 4,314,956 A | 2/1982 | Baney et al. | |
| 4,324,901 A | 4/1982 | West | |
| 4,335,266 A | 6/1982 | MicKelsen et al. | |
| 4,510,094 A | 4/1985 | Drahnak | |
| 4,530,879 A | 7/1985 | Drahnak | |
| 4,542,257 A | 9/1985 | Fraser | |
| 4,766,176 A | 8/1988 | Lee et al. | |
| 5,017,654 A | 5/1991 | Togashi et al. | |
| 5,194,649 A | 3/1993 | Okawa | |
| 5,441,897 A | 8/1995 | Noufi et al. | |
| 5,496,961 A | 3/1996 | Dauth et al. | |
| 5,702,584 A * | 12/1997 | Goenka et al. | 205/158 |
| 5,972,512 A * | 10/1999 | Boisvert et al. | 428/409 |
| 6,537,845 B1 | 3/2003 | McCandless et al. | |
| 7,037,592 B2 | 5/2006 | Zhu et al. | |
| 7,271,333 B2 | 9/2007 | Fabick et al. | |
| 2003/0059526 A1 | 3/2003 | Benson et al. | |
| 2003/0064292 A1 | 4/2003 | Neudecker et al. | |
| 2003/0068559 A1 | 4/2003 | Armstrong et al. | |
| 2003/0136440 A1* | 7/2003 | Machida et al. | 136/243 |
| 2005/0061437 A1 | 3/2005 | Goto et al. | |
| 2006/0102230 A1* | 5/2006 | Tuttle | 136/265 |
| 2006/0134431 A1* | 6/2006 | Yasuda et al. | 428/411.1 |
| 2006/0240262 A1 | 10/2006 | Zhu et al. | |
| 2008/0051548 A1 | 2/2008 | Bailey et al. | |

FOREIGN PATENT DOCUMENTS

| | | |
|---|---|---|
| EP | 0881695 A2 | 12/1998 |
| EP | 12071882 A2 | 5/2002 |
| EP | 1388572 A1 | 2/2004 |
| EP | 1489666 A1 | 12/2004 |
| JP | 2181975 | 7/1990 |
| JP | 5218482 | 8/1993 |
| JP | 7263733 | 10/1995 |
| JP | 8181339 | 7/1996 |
| JP | 9132716 | 5/1997 |
| JP | 10321887 | 12/1998 |
| JP | 10321888 | 12/1998 |
| WO | WO 03/022564 | 3/2003 |
| WO | WO2005/006451 A1 | 1/2005 |
| WO | WO2005/017058 A1 | 2/2005 |
| WO | WO2005/052078 A2 | 9/2005 |
| WO | WO2006/088645 A1 | 8/2006 |
| WO | WO2006/088646 A1 | 8/2006 |
| WO | WO2007/018283 A1 | 2/2007 |
| WO | WO2007/018756 A1 | 2/2007 |
| WO | WO2007/092032 A2 | 8/2007 |
| WO | WO2007/092118 A2 | 8/2007 |
| WO | WO2007/097835 A2 | 8/2007 |
| WO | WO2007/120905 A2 | 10/2007 |
| WO | WO2007/121006 A2 | 10/2007 |
| WO | WO2007/123898 A1 | 11/2007 |
| WO | WO2007123901 A1 | 11/2007 |
| WO | WO 2007145885 | 12/2007 |
| WO | WO 2008013611 | 1/2008 |
| WO | WO 2008036769 | 3/2008 |
| WO | WO 2008045104 | 4/2008 |

OTHER PUBLICATIONS

PCT/US2007/066902, International Preliminary Report on Patentability Chapter I, mailed Oct. 22, 2008, 6 pages.
PCT/US07/09359, Informal Comments dated Oct. 24, 2008, 4 pages.
PCT/US07/09359, International Preliminary Report on Patentability Chapter I, mailed Oct. 22, 2008, 6 pages.
PCT/US07/09365, Informal Comments dated Oct. 18, 2008, 3 pages.
PCT/US07/09365, International Preliminary Report on Patentability Chapter I, mailed Oct. 22, 2008, 6 pages.
U.S. Appl. No. 11/794,924.
U.S. Appl. No. 11/794,925.
PCT/US2006/045158.
PCT/US2006/045107.
PCT/US2007/013835.
PCT/US2007/013135.
PCT/US2007/070231.
U.S. Appl. No. 60/902,723.
U.S. Appl. No. 60/902,805.
U.S. Appl. No. 60/902,719.
U.S. Appl. No. 60/849,728.
U.S. Appl. No. 60/899,845.
U.S. Appl. No. 60/915,129.
U.S. Appl. No. 60/915,137.
U.S. Appl. No. 60/875,952.
U.S. Appl. No. 60/875,953.
U.S. Appl. No. 60/891,165.
U.S. Appl. No. 60/955,245.
U.S. Appl. No. 60/902,806.
Birkmire, R., Eser, E., Fields, S. & Shafarman, W., Cu(InGa)Se$_2$ Solar Cells on a Flexible Polymer Web; Space Photovoltaic Research and Technology Conference at NASA Glenn in Cleveland, Ohio (Sep. 2005), pp. 191-194.
Guo, A., Fry, B.E. & Neckers, D.C., Highly Active Visible-Light Photocatalysts for Curing a Ceramic Precursor, *Chemistry of Materials,* vol. 10, No. 2 (Feb. 1998) pp. 531-536.
Matulionis, I, Han, S., Drayton, J.A., Price, K.J. & Compaan, A.D., CdTe Solar Cells on Molybdenum Substrates Mat. Res. Soc. Symp. Proc. 668, H8.23.1 (2001).
SBIR/STTR Proposal #: 021NM-1056 Phase I, Abstract, retrieved from http://www.sbirsttrmall.com/award/AwardDetails.aspx?pk=7394 Feb. 6, 2006; 2 pages.
SBIR/STTR Proposal #: 021NM-1056 Phase II, Abstract, retrieved from http://www.sbirsttrmall.com/award/AwardDetails.aspx?pk=8955 Feb. 6, 2006; 2 pages (Apr. 2003).
Reese, H., Development of Silicone Substrates to Be Used With CIGS Deposition, Final Report, Feb. 1, 2005, Contract F49620-03-C-0047, pp. 1-59.
International Search Report, PCT/US2007/009365, mailed Sep. 10, 2007.
International Search Report, PCT/US2007/009359, mailed Sep. 10, 2007.

* cited by examiner

REINFORCING STRUCTURES FOR THIN-FILM PHOTOVOLTAIC DEVICE SUBSTRATES, AND ASSOCIATED METHODS

CROSS-REFERENCE TO RELATED APPLICATIONS

This application claims priority to U.S. Provisional Patent Application No. 60/792,852 filed 18 Apr. 2006, U.S. Provisional Patent Application No. 60/792,871 filed 18 Apr. 2006, and U.S. Provisional Patent Application No. 60/792,770 filed 18 Apr. 2006, each of which is incorporated herein by reference.

U.S. GOVERNMENT RIGHTS

This invention was made with Government support under SBIR Grant Nos. F29601-03-C-0068 and F29601-03-C-0028 awarded by the Air Force and AFOSR Grant No. F49620-03-C-0047 awarded by the Air Force. The Government may have certain tights in this invention.

BACKGROUND

There are many applications for lightweight, flexible, high efficiency and low cost solar power arrays which convert electromagnetic energy (e.g., sunlight) into useful electric power. For example, the spacecraft industry seeks lightweight and flexible solar power arrays to enable specific missions; they also desire to lower the cost of these missions. Lightweight and flexible solar power arrays are also sought in the emerging high-altitude airship industry.

Flexible solar power arrays often include a plurality of flexible thin-film photovoltaic (TFPV) devices which are operable to convert electromagnetic energy into electric current. Each TFPV device is formed of a plurality of different thin-film layers on a substrate. The substrate thus forms the base of the TFPV device and influences its characteristics. Substrates today commonly consist of glass, metallic foils, or polyimides.

SUMMARY

In an embodiment, one reinforced substrate for use in a photovoltaic device includes a polymer base material and a reinforcing structure bonded with the base material to present the reinforced substrate. The reinforced substrate presents a surface in a condition that is made-ready for deposition of thin film layers of the photovoltaic device.

In an embodiment, one thin film photovoltaic device includes a reinforced substrate including a polymer base material and a reinforcing structure bonded with the base material to present the reinforced substrate. A plurality of thin film layers are formed on a surface of the reinforced substrate.

In an embodiment, a process of producing a reinforced substrate includes combining a fluid base material and a fiber reinforcing structure to form an impregnated fiber reinforcement. The impregnated fiber reinforcement is cured to form the reinforced substrate, and the reinforced substrate is annealed.

In an embodiment, a process of producing an array of thin film photovoltaic devices on a reinforced substrate includes cutting a plurality of first scribes in a stack of thin film layers formed on the reinforced substrate down to a surface of the reinforced substrate. A plurality of second scribes in the stack of thin film layers are cut adjacent to the first scribes down to a surface of a back contact layer. The plurality of first scribes are filled with an insulator, and a top contact layer is applied on a top surface of the stack of thin film layers. A plurality of third scribes are cut through the top contact layer and the stack of thin film layers down to the surface of the back contact layer.

DETAILED DESCRIPTION

Figure 1:
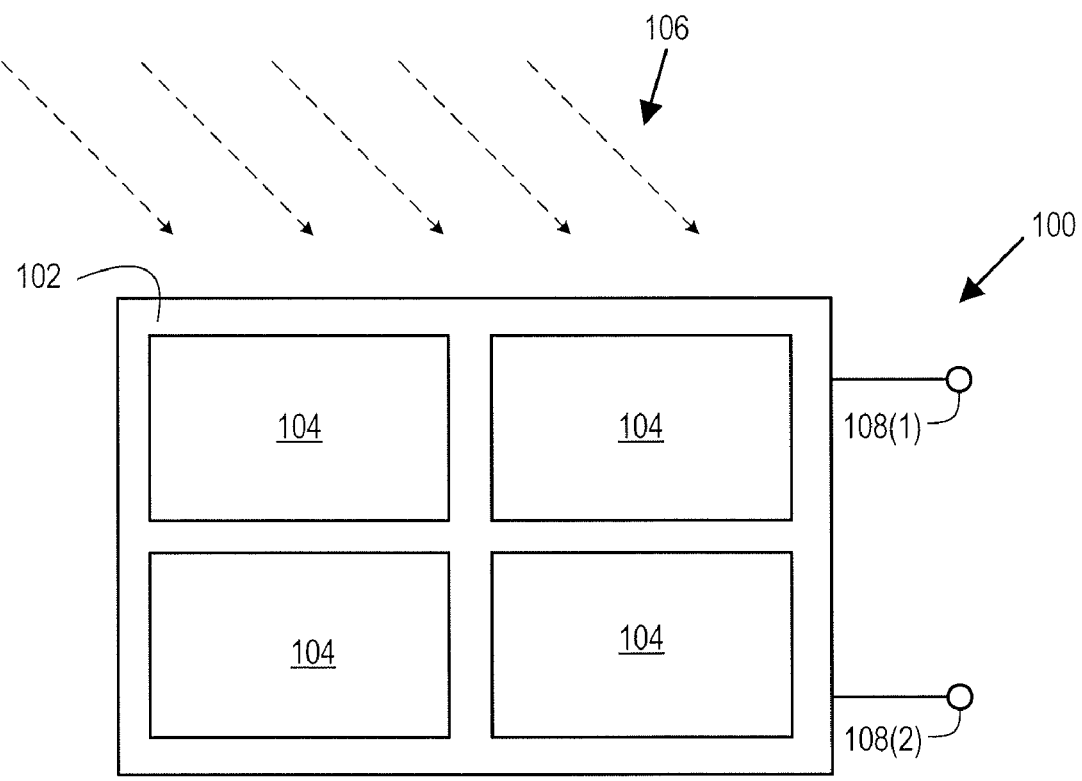
FIG. 1 is a top plan view of one solar power array including a reinforced substrate, according to an embodiment.

The present disclosure may be understood by reference to the following detailed description of the drawings. It is noted that for purposes of illustrative clarity, certain elements in the drawings may not be drawn to scale. Specific instances or parts of an item may be referred to by use of a character in parentheses (e.g., back contact layers 1052(1) and 1052(2), described herein below), while numerals without parentheses refer to any such item (e.g., any back contact layer 1052).

As previously noted, there is a need for solar power arrays of TFPV devices that are flexible and lightweight, have a high conversion efficiency and have a low cost. A substrate forms the base of each TFPV device; accordingly, a substrate must possess certain characteristics in order for a TFPV device to meet such goals. Such characteristics include the following:

First, the substrate must be flexible and lightweight in order for TFPV devices built on the substrate and a solar power array incorporating the TFPV devices to be flexible and lightweight.

Second, it is desirable that the substrate possess sufficient mechanical strength to survive TFPV device production processing steps which are required for economical production of TFPV devices. For example, roll-to-roll processing techniques may be used to produce TFPV devices in a more efficient and lower cost manner than some other production techniques. However, roll-to-roll processing techniques exert more mechanical stress on the substrate than some other processing techniques; accordingly, a substrate to be used with roll-to-roll processing techniques must possess significant mechanical strength.

Third, the substrate should tolerate high processing temperatures to enable production of high conversion efficiency TFPV devices, which generally requires processing temperatures in excess of 500 degrees Celsius (° C.).

Fourth, it is desirable that the substrate possess thermal expansion properties (e.g., a coefficient of thermal expansion) that are sufficiently matched to that of the materials forming the TFPV devices to avoid mechanical failures during device processing and/or subsequent operation of the TFPV devices.

Fifth, the substrate should have an electrical resistivity high enough to support monolithic integration of TFPV devices on a common substrate, which is the formation of a plurality of TFPV devices on a common substrate. Monolithic integration may reduce the cost and size, increase the reliability, and promote ease of manufacturing of an array of TFPV devices.

A substrate including a reinforcing structure ("reinforced substrate") may possess one or more of the five characteristics discussed above. FIG. 1, which is a top plan view of a solar power array 100, illustrates one embodiment of a reinforced substrate. Solar power array 100 includes a plurality of TFPV devices 104 formed on a common reinforced substrate 102. Accordingly, TFPV devices 104 are monolithically integrated onto reinforced substrate 102 in FIG. 1; however, reinforced substrate 102 is not restricted to monolithic integration applications. TFPV devices 104 generate electric current from electromagnetic energy 106 (e.g., sunlight) incident on solar power array 100; the electric current may be accessed via electrical terminals 108(1) and 108(2). An embodiment of solar power array 100 is relatively flexible and lightweight, and may be used to provide electric power to spacecrafts or high altitude airships. The relative flexibility of solar power array 100 for example allows its use in non-planar applications.

Reinforced substrate 102 is a hybrid or composite structure including a base material and a reinforcing structure bonded to the base material. The areas or portions of reinforced substrate 102 that are composed of the base material and the reinforcing structure depend on the materials used to form reinforced substrate 102 as well as its intended use. As discussed below, the base material may be a polymer such as a silicone composition, and the reinforcing structure may include particles, fibers and/or metallic foil.

The reinforcing structure may provide mechanical strength to reinforced substrate 102, thereby enabling formation of reinforced substrate 102 of base materials that would otherwise possess insufficient mechanical strength for formation of an acceptable substrate. Accordingly, the reinforcing structure may allow reinforced substrate 102 to be formed of base materials that are flexible, have a high electrical resistivity and/or are tolerant of high processing temperatures. The reinforcing structure may also be used to control the coefficient of thermal expansion ("CTE") of reinforced substrate 102. The CTE may be critical because it may affect whether a TFPV device formed on reinforced substrate 102 cracks during its processing and/or its operation due to a mismatch in CTE between reinforced substrate 102 and thin film layers formed thereon.

The reinforcing structure can affect physical characteristics of reinforced substrate 102 on a macro and/or nano scale. A reinforcing structure that affects characteristics of a reinforced substrate on a nano scale ("nano scale reinforcing structure") is discussed below with respect to FIG. 2; reinforcing structures that affects characteristics of a reinforced substrate on a macro scale ("macro scale reinforcing structure") are discussed below with respect to FIGS. 3, 4A and 4B.

Figure 2:
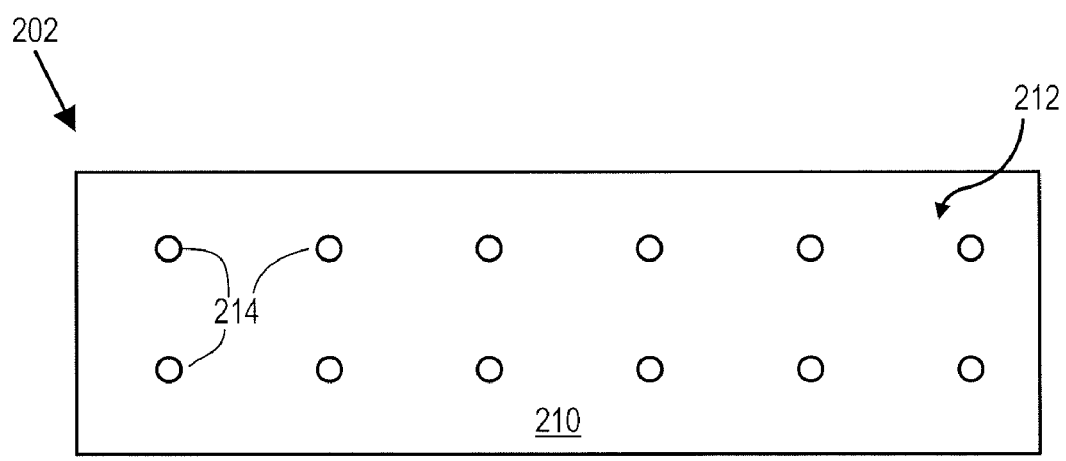
FIG. 2 is a mid sectional side view of one reinforced substrate including nano-filler, according to an embodiment.

FIG. 2 is a mid sectional side view of a nano scale reinforced substrate 202 including a base material 210, which may be a polymer such as a silicone composition, and nano-filler 212 disposed within base material 210. Reinforced substrate 202 may have a high electrical resistivity enabling its use in monolithic integration applications. Nano filler 212, which includes a plurality of small particles 214 (only three of which are labeled to promote illustrative clarity), affects the physical characteristics of reinforced substrate 202 on a nano scale. Nano-filler 212 may increase mechanical strength of substrate 202 and/or reduce its CTE. A low CTE may improve manufacturability of TFPV devices formed on reinforced substrate 202 by reducing a mismatch in coefficients of thermal expansion between reinforced substrate 202 and thin film layers formed thereon, thereby reducing cracking of the TFPV devices. The portion of reinforced substrate 202 formed of nano-filler 12 will vary as a function of the characteristics of base material 210, the characteristics of nano-filler 212 and an intended use of reinforced substrate 202. In one embodiment, nano-filler 212 composes one of the following portions of reinforced substrate 202: at least 0.003% (w/w), 0.003% to 20% (w/w), or 0.003% to 0.2% (w/w).

Particles 214 are illustrated in FIG. 2 as being round. However, particles 214 may be of any acceptable shape, regular or irregular. Particles 214 may be in the form of discontinuous fibers; in such case, the fibers may act together in a web configuration in order to increase the mechanical strength of reinforced substrate 202. Particles 214 may have any sufficiently small size. In one embodiment, particles 214 have a diameter of less than 1 micrometer (μm), with a typical diameter of less than 200 nanometer (nm). Furthermore, although particles 214 are illustrated as being uniformly distributed throughout reinforced substrate 202, particles 214 may be non-uniformly distributed throughout reinforced substrate 202.

Nano-filler 210 may be formed of suitable materials including, but not limited to, functionalized carbon nanofibers, aluminum-based materials such as aluminum oxide and aluminum trihydroxide, boron-based materials such as boric oxide and boric acid, mica, colloidal silica and combinations thereof. An exemplary nano-filler 212 is Pyrograph III carbon nanofiber, commercially available from Applied Sciences, Inc. of Cedarville, Ohio, United States of America.

Figure 3:
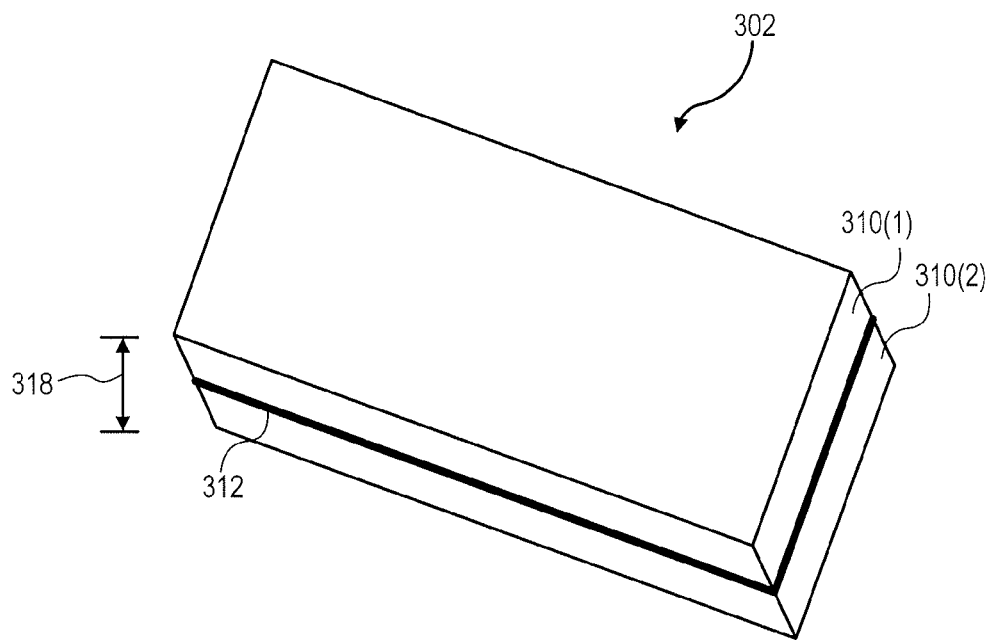
FIG. 3 is a top perspective view of one reinforced substrate including metal foil, according to an embodiment.

Nano-filler 212 may cooperate with one or more macro scale reinforcing structures, such as metal foil discussed below with respect to FIG. 3, and/or fibers discussed below with respect to FIG. 4, to further reinforce a substrate. In this case, nano filler 212 may be disposed in base material 210 using mixing methods known in the art, prior to combining base material 210 with one or more macro scale reinforcing structures, as discussed below.

An example of a macro scale reinforcing structure is a metal foil. FIG. 3 is a top perspective view of a reinforced substrate 302 formed of base material 310 including an adjoining metal foil reinforcing structure 312. Base material 310 may be a polymer; in an embodiment, base material 310 is one or more silicone composition layers, and the silicone composition layers and metal foil reinforcing structure 312 are bonded to each other. In an embodiment, base material 310 includes nano-filler 212 of FIG. 2. Reinforced substrate 302 is illustrated in FIG. 3 as having two layers 310(1) and 310(2) of base material; however, reinforced substrate 302 can have any number of base material layers. Furthermore, although reinforced substrate 302 is illustrated in FIG. 3 as having a layer of base material 310 formed one two sides of metal foil reinforcing structure 312, a layer of base material 310 need only be formed on a single side of metal foil reinforcing structure 312. Metal foil reinforcing structure 312 may, but need not, be formed from stainless steel, titanium, aluminum, kovar, invar, tantalum, brass, niobium and combinations thereof.

Embodiments of reinforced substrate 302 include base material 310 consisting of layers of a silicone composition. In such embodiments, the reinforced substrate has an overall thickness 318 of 13 to 1006 µm or of 15 to 500 µm, the silicone composition layers have a combined thickness of 0.5 to 6 µm, and the metal foil reinforcing structure 312 has a thickness of 12.5 to 1,000 µm.

Another example of a macro scale reinforcing structure is a plurality of fibers forming a fiber reinforcing structure that is capable of being combined within a base material (e.g., a polymer) to create a reinforced substrate. Such reinforced substrate may hereinafter be referred to as a "fiber reinforced substrate." The fiber reinforcing structure can be any acceptable arrangement of fibers, such as a woven fabric (e.g., cloth), a nonwoven fabric (e.g., a mat or roving), or loose (e.g., individual) fibers. The fibers may be cylindrical in shape and have one of the following ranges of diameters: 1 to 100 µm, 1 to 20 µm or 1 to 10 µm. Typically, the fibers have a high modulus and a high tensile strength. Loose fibers are typically continuous, meaning the fibers extend throughout the base material in a generally unbroken manner. The fibers may be formed of materials including glass, quartz, metal, carbon, sapphire, graphite, nylon, polyester, aramid (e.g., Kevlar® and Nomex® fibers), polyethylene, polypropylene and silicon carbide. TABLE 1 below lists characteristics of exemplary fibers that may be used in a fiber reinforcing structure.

TABLE 1

| | |
|---|---|
| Young's modulus at 25° C. | at least 3 GPa; 3 to 1,000 GPa; 3 to 200 GPa; or 10 to 100 GPa |
| Tensile strength at 25° C. | at least 50 MPa; 50 to 10,000 MPa; 50 to 1,000 MPa; or 50 MPa to 500 MPa |

Embodiments of fiber reinforced substrates may, but need not, have characteristics listed below in TABLE 2. Transparency in TABLE 2 is defined as the percentage of visible light incident on the fiber reinforced substrate that passes through the fiber reinforced substrate. Transparency is dependent on factors including the composition of the base material, the thickness of the fiber reinforced substrate, and the refractive index of the fiber reinforcing structure.

TABLE 2

| | |
|---|---|
| Portion of fiber reinforced substrate | 10% to 99% (w/w); 30% to 95% (w/w); 60% |
| composed of base material on a pre-curing weight basis | 10% to 99% (w/w); 30% to 95% (w/w); 60% to 95% (w/w) or 80% to 95% (w/w). |
| Portion of fiber reinforced substrate that is fiber reinforcing structure | at least 5% (w/w); or 20% to 50% (w/w) |
| Portion of fiber reinforced substrate that is nano-filler | at least 0.003% (w/w); 0.003% to 20% (w/w); or 0.003% to 0.2% (w/w) |
| Thickness of fiber reinforced substrate | 15 to 500 µm; 15 to 300 µm; 20 to 300 µm; or 25 to 200 µm |
| CTE from about 23 to 200° C. | 0 to 80 µm/m ° C.; 0 to 20 µm/m ° C.; 2 to 10 µm/m ° C. |
| Tensile strength at 25° C. | 50 to 200 Mpa; 80 to 200 Mpa; or 100 to 200 MPa |

TABLE 2-continued

| | |
|---|---|
| Young's modulus at 25° C. | 2 to 10 GPa; 2 to 6 GPA; or 3 to 5 GPa |
| Transparency | at least 15%; at least 60%; at least 75%; or at least 85% |

In an embodiment, the fiber reinforced substrate has a flexibility such that it can be bent over a cylindrical steel mandrel having a diameter less than or equal to 3.2 millimeter (mm) without cracking, where the flexibility is determined as described in ASTM Standard D522-93a, Method B.

The fiber reinforcing structure is typically heat-treated prior to use to remove organic contaminants. For example, the fiber reinforcing structure may be heated in air at an elevated temperature (e.g., 575° C.) for a suitable period of time (e.g., 2 hours).

Figure 4A:
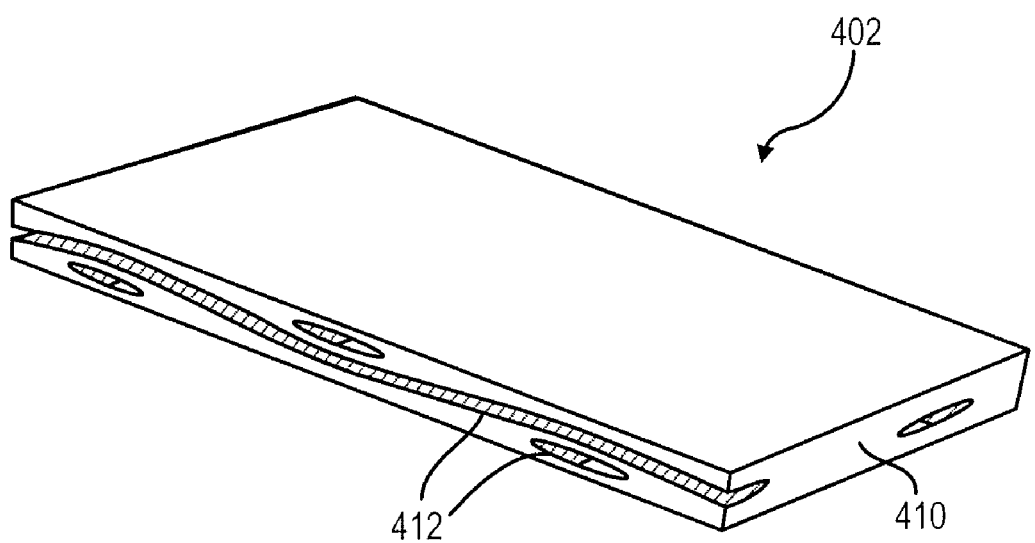
FIG. 4A is a top perspective view of one reinforced substrate including a fiber reinforcing structure, according to an embodiment.

FIG. 4A is a top perspective view of a fiber reinforced substrate 402 including base material 410 and a fiber reinforcing structure 412. In one embodiment, base material 410 is a polymer (e.g., a silicone composition) that is flexible, has a high electrical resistivity and/or is tolerant of high processing temperatures. Base material 410 includes one or more layers, and may include nano filler 212, as discussed above with respect to FIG. 2. Reinforced substrate 402 has a thickness ranging from 20 to 60 µm.

Fiber reinforcing structure 412 and optional nano-filler 212 may permit fiber reinforced substrate 402 to possess sufficient mechanical strength to be used as a substrate for TFPV devices. Additionally, optional nano-filler 212 may reduce the overall CTE of fiber reinforced substrate 402, thereby improving manufacturability of TFPV devices built upon fiber reinforced substrate 402. For example, an embodiment of fiber reinforced substrate 402 including nano-filler 212 can withstand annealing temperatures in excess of 500° C. without exhibiting substantial cracking.

Fiber reinforcing structure 412 is illustrated in FIG. 4A as being disposed in an essentially horizontal plane located near the vertical center of base material 410. However, fiber reinforcement structure 412 may be disposed in other locations within base material 410.

Figure 4B:
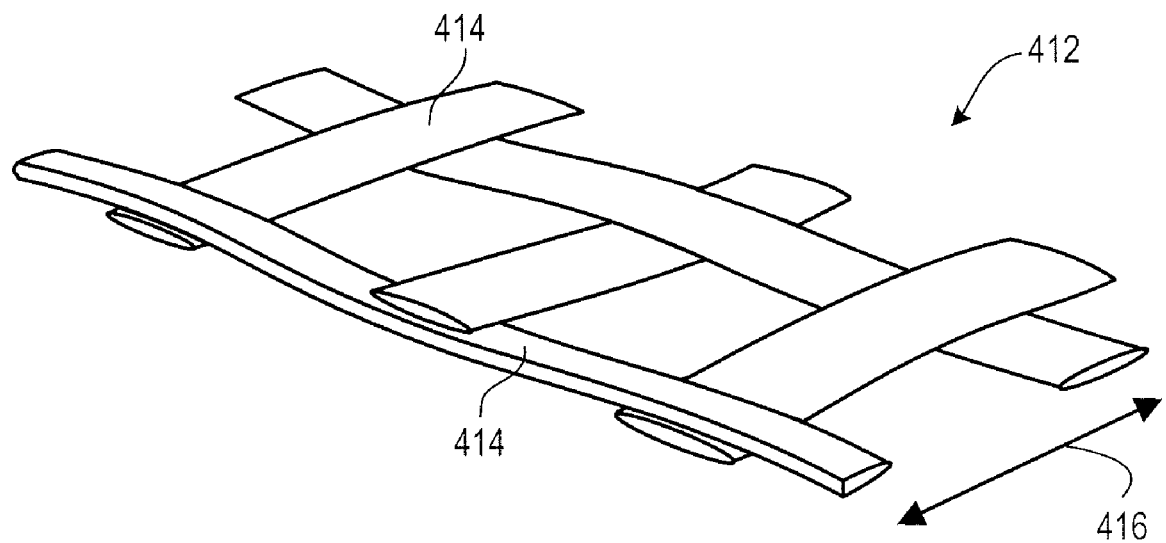
FIG. 4B is a top perspective view of the fiber reinforcing structure of FIG. 4A.

FIG. 4B is a top perspective view of fiber reinforcing structure 412. Fiber reinforcing structure 412 as illustrated in FIG. 4B includes bundles of fibers 414 woven in a web configuration. In a non-limiting example, fiber reinforcing structure 412 has a width 416 of 100 to 200 µm and a thickness of 20 to 40 µm, and bundles of fibers 414 each include 50 to 100 individual fibers with diameters ranging from 3 to 6 µm. Fiber reinforcing structure 412 may also have other configurations. In one aspect, fiber reinforcing structure 412 includes unidirectional bundles of fibers placed parallel to each other. As another example, fiber reinforcing structure 412 may include bundles of fibers placed perpendicular to each other in grid configuration but not woven together.

Preferably but optionally, reinforced substrates 102, 202, 302, and 402 are made ready for deposition of solid state circuitry (e.g., back contact layer 752, 852, or 952 or interface layer 750, 850, or 950) or other materials by, for example, plasma cleaning. The plasma cleaning step is performed in an embodiment using a RF sputtering process under a pressure ranging from approximately twenty to five hundred millitorr in the presence of oxygen or air. By way of example and not of limitation, power sources for RF sputtering may range from approximately 100 to 500 Watts at a frequency of about 14 MHz from an approximately 182 square centimeter metal cathode.

It is also possible to planarize a surface of reinforced substrates 102, 202, 302, and 402 by use of chemical, mechanical polishing, cleaning with solvents, or other such techniques as may be known in the art to prepare a substrate for deposition of thin film or thick film materials.

Figure 5:
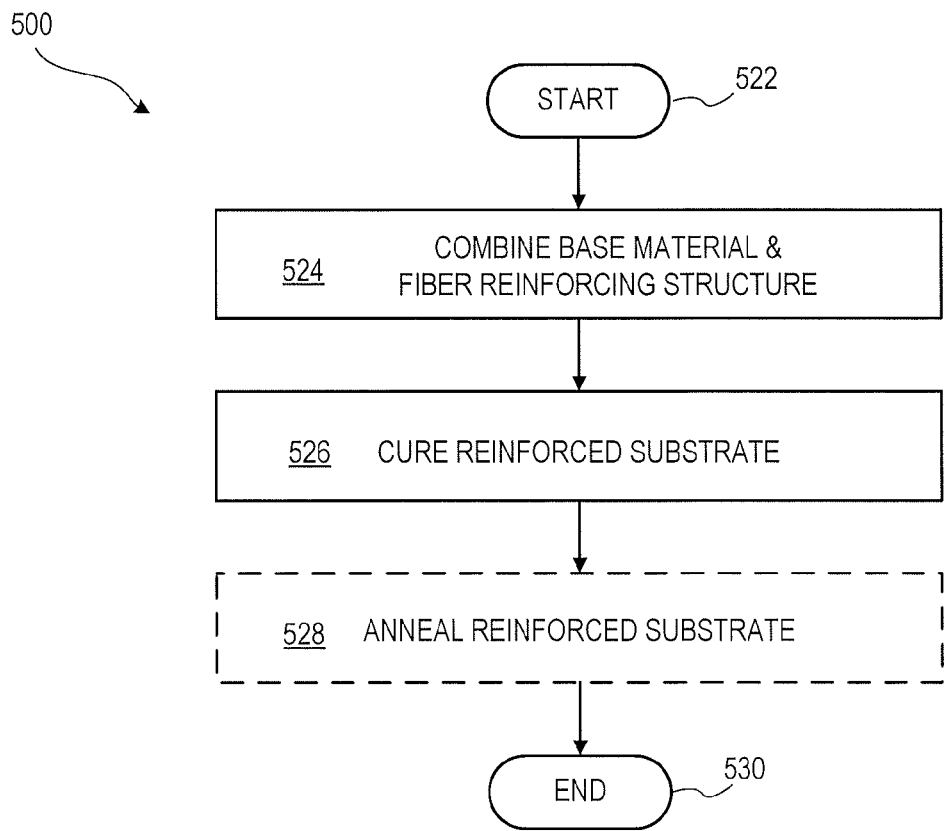
FIG. 5 is a flow chart of one process of producing a reinforced substrate, according to an embodiment.

FIG. 5 is a flow chart of a process 500 of producing a reinforced substrate including a fiber reinforcing structure. Process 500 may be used to produce fiber reinforced substrate 402 of FIG. 4, for example. Process 500 begins 522 and proceeds to step 524 where a base material and a fiber reinforcing structure are combined to form an impregnated fiber reinforcement. In step 524, a fluid base material is applied around the fiber reinforcing structure or the fiber reinforcing structure is introduced into the base material to form an impregnated fiber reinforcement. In one example of step 524, a base material such as a liquid silicone composition is applied around a woven fiber reinforcing structure. In step 526, the impregnated fiber reinforcement is cured to form the reinforced substrate. "Cured" as defined herein means that the base material, which can be in the form of the component parts, a mixture, a solution or a blend, is exposed to room temperature air, heated at elevated temperatures or exposed to UV electromagnetic energy, an electron beam or microwave electromagnetic energy. Heating can be achieved using any known conventional means, such as by placing the base material or, in this case, the impregnated fiber reinforcement, into an air-circulating oven. In one example of step 526, an impregnated fiber reinforcement including a woven fabric reinforcing structure impregnated with a liquid silicone composition is thermally cured to form a fiber reinforced substrate. Step 528 is optional; in step 528, the reinforced substrate is annealed at a high temperature to drive off residual gases and unreacted components. In one example of step 528, the reinforced substrate is annealed at a temperature ranging from 400 to 600° C. in an air, oxygen, argon, nitrogen, or vacuum. Process 500 subsequently ends 530 after annealing or after curing if step 528 is not executed.

Figure 6:
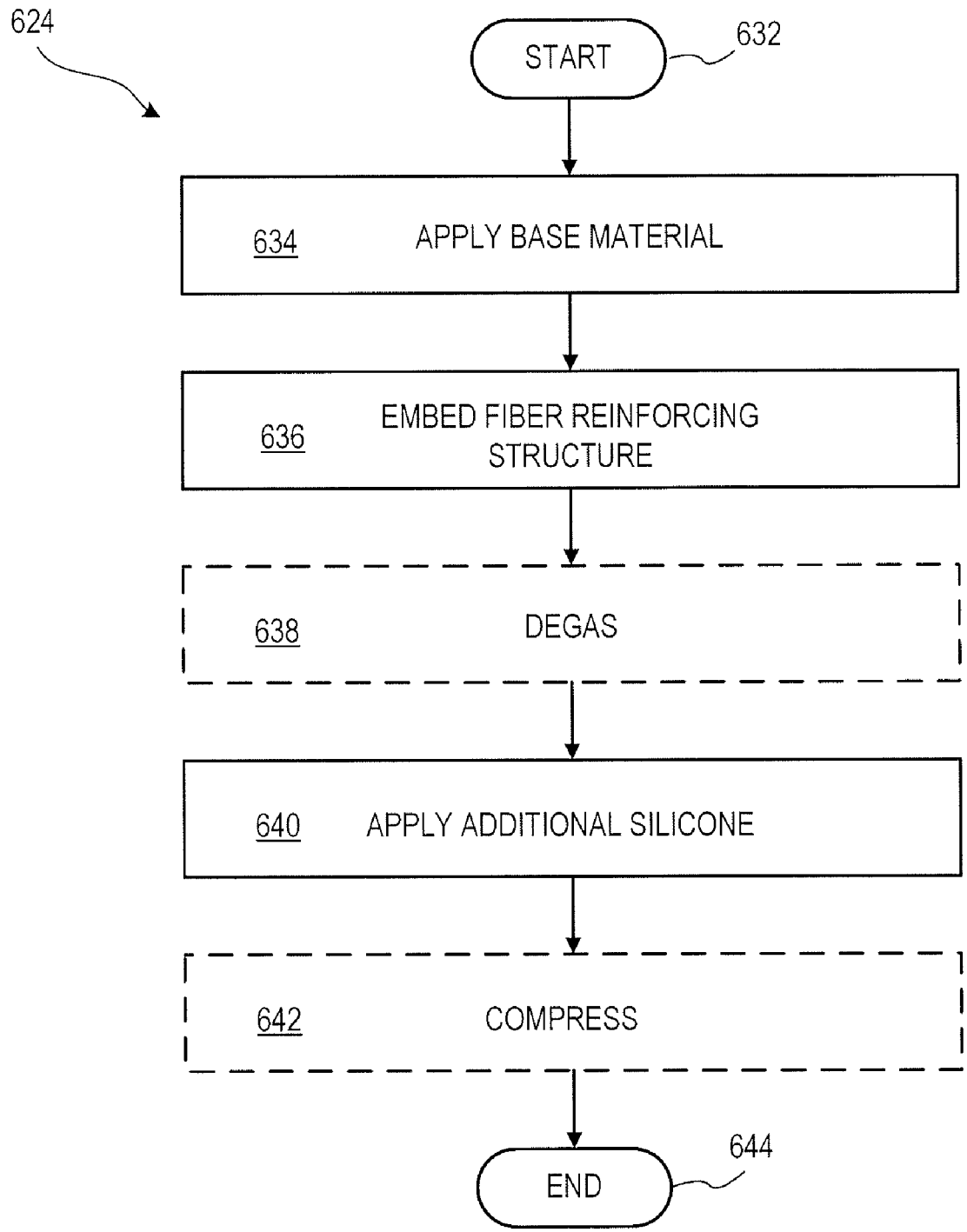
FIG. 6 is a flow chart of one process of combining base material and a fiber reinforcing structure, according to an embodiment.

Step 524 may be executed in a variety of manners. FIG. 6 illustrates a process 624, which is one process of combining base material and a fiber reinforcing structure to form an impregnated fiber reinforcement. Process 624 for example executes step 524 of process 500, FIG. 5. Process 624 starts 632 and proceeds to step 634, where a silicone composition base material is applied to a release liner to form a silicone film. The silicone composition can be applied to the release liner using conventional coating techniques, such as spin coating, dipping, spraying, brushing or screen-printing. The silicone composition is applied in an amount sufficient to embed the fiber reinforcing structure, as described with respect to step 636, below. The release liner can be any rigid or flexible material having a surface from which the reinforced silicone resin film can be removed without damage by delamination after the silicone composition is cured. Examples of release liners include, but are not limited to, nylon, polyethyleneterephthalate and polyimide.

In step 636, the fiber reinforcing structure is embedded in the silicone film to form an embedded fiber reinforcement. The fiber reinforcing structure may be embedded in the silicone film by simply placing the fiber reinforcing structure on the silicone film and allowing the silicone composition to saturate the fiber reinforcing structure. Optionally, the fiber reinforcing structure may first be deposited on the release liner, followed by the application of the silicone composition onto the fiber reinforcing structure. In another embodiment of process 624, when the fiber reinforcing structure is woven or nonwoven fabric, steps 634 and 636 are substituted with a single step (not shown in FIG. 6), wherein the fiber reinforcing structure can be impregnated with the silicone composition by passing it through the silicone composition without using the release liner. The fabric is typically passed through the silicone composition at a rate of from 1 to 1,000 cm/s at room temperature (~23±2° C.).

In optional step 638, the embedded fiber reinforcement is degassed. The embedded fiber reinforcement may be degassed by subjecting it to a vacuum at a temperature ranging from room temperature (~23±2° C.) to 60° C., for a period of time sufficient to remove air entrapped in the embedded reinforcement. In one example of optional degassing step 628, the embedded fiber reinforcement is subjecting to pressure ranging from 1,000 to 20,000 Pa for 5 to 60 minutes at room temperature.

In step 640, additional silicone composition is applied to the (optionally degassed) embedded fiber reinforcement to form an impregnated fiber reinforcement. The silicone composition may be applied to the degassed embedded fiber reinforcement using conventional methods, as described above. Additional cycles (not shown in FIG. 6) of degassing (step 628) and application of silicone composition (step 640) may occur.

In optional step 642, the impregnated fiber reinforcement is compressed to remove excess silicone composition and/or entrapped air, and to reduce the thickness of the impregnated fiber reinforcement. The impregnated fiber reinforcement can be compressed using conventional equipment such as a stainless steel roller, a hydraulic press, a rubber roller or a laminating roll set. The impregnated fiber reinforcement is typically compressed at a pressure ranging from 1,000 Pa to 10 MPa and at a temperature ranging from room temperature (~23±2° C.) to 50° C. Process 624 ends 644 after step 640 or optional step 642.

Curing step 526 of process 500 may be executed in a variety of manners. In one embodiment of step 526, the impregnated fiber reinforcement is heated at a temperature sufficient to cure the silicone composition and form the cured impregnated fiber reinforcement. The impregnated fiber reinforcement may be heated at atmospheric, sub-atmospheric or supra-atmospheric pressure. The impregnated fiber reinforcement is for example heated at atmospheric pressure, within one of the following temperature ranges: from room temperature (~23±2° C.) to 250° C., from room temperature to 200° C. or from room temperature to 150° C. The impregnated fiber reinforcement is heated for a length of time sufficient to cure (cross-link) the base material. For example, the impregnated fiber reinforcement may be heated at 150 to 200° C. for 0.1 to 3 hours.

In another embodiment of step 526, the impregnated fiber reinforcement is heated in a vacuum at a temperature of 100 to 200° C. and at a pressure of 1,000 to 20,000 Pa for 0.5 to 3 hours, to form the cured impregnated fiber reinforcement. The impregnated fiber reinforcement may be heated in the vacuum using a conventional vacuum bagging process. In one aspect, a bleeder (e.g., polyester) is applied over the impregnated fiber reinforcement, a breather (e.g., nylon, polyester) is applied over the bleeder, a vacuum bagging film (e.g., nylon) equipped with a vacuum nozzle is applied over the breather, the assembly is sealed with tape, a vacuum (e.g., 1,000 Pa) is applied to the sealed assembly, and the evacuated bag is heated as described above.

Reinforced substrates including, but not limited to, reinforced substrates 102, 202, 302 and 402 of FIGS. 1-4, respectively, may be used to form one or more flexible and light-weight TFPV devices having high conversion efficiency. Such TFPV devices may be produced using roll to roll techniques, and a plurality of the TFPV devices may be monolithically integrated onto a single reinforced substrate.

Figure 7:
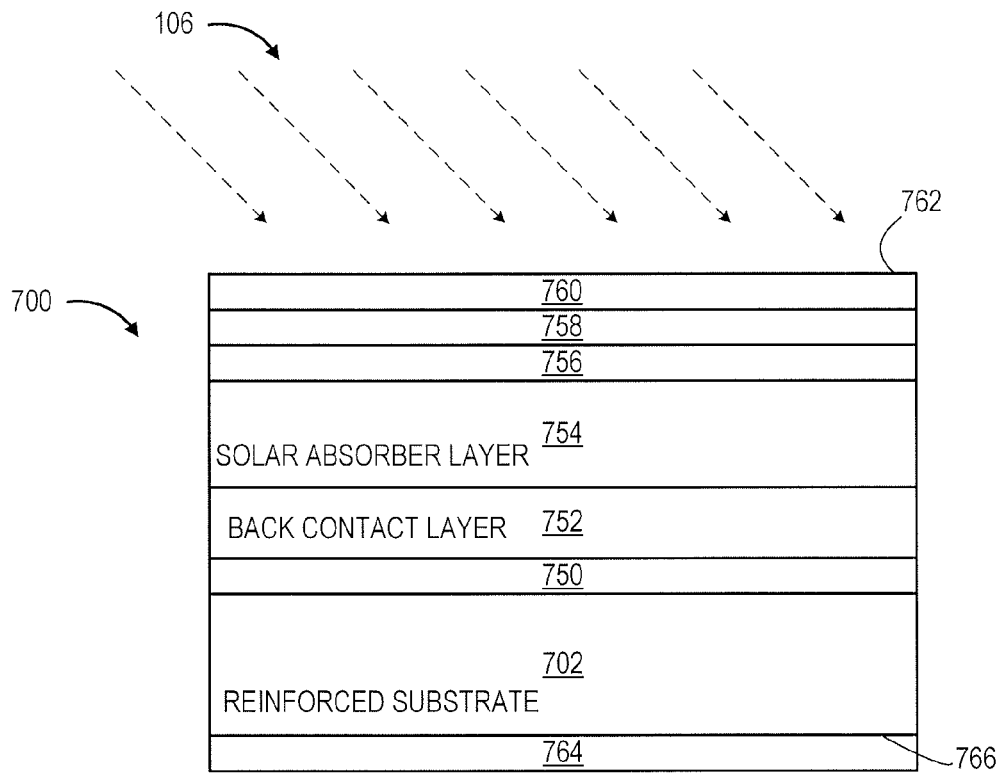
FIG. 7 is a mid sectional view of one TFPV device, according to an embodiment.

FIG. 7 is a mid-sectional side view of a TFPV device 700 formed on reinforced substrate 702. TFPV device 700 converts incident electromagnetic energy 106 into an electric current. Reinforced substrates 102, 202, 302 or 402 may serve as reinforced substrate 702. Although FIG. 7 illustrates a single TFPV device 700 formed on reinforced substrate 702, a plurality of TFPV devices may (and likely would) be formed on reinforced substrate 702. In one embodiment, reinforced substrate 702 has a width of about 33 cm, a thickness of about 0.005 cm and a length of up to about 300 m, and is obtained from a payout roll.

TFPV device 700 has a vertical stack of four to eight thin film layers deposited on reinforced substrate 702. An optional interface layer 750 may be formed on reinforced substrate 702 to enhance adhesion of a back contact layer 752 to reinforced substrate 702 and to minimize back contact cracking. Interface layer 750 may have a CTE between that of reinforced substrate 702 and back contact layer 752 to minimize back contact cracking. Interface layer 750 may be formed of nickel-vanadium, copper, brass, indium tin oxide (ITO) and/or other materials known not to be detrimental to TFPV device 700 if diffusion of these materials were to occur.

Back contact layer 752 is formed on interface layer 750 if an interface layer is used; otherwise, back contact layer 752 is formed directly on reinforced substrate 702. In an embodiment, back contact layer 752 is approximately 0.5 μm thick and includes molybdenum. If back contact layer 752 is formed of molybdenum directly on reinforced substrate 702, back contact layer 752 may further include oxygen to alter the properties of back contact layer 752 to reduce back contact cracking. An additional stress relief layer 764 is optionally formed on a side 766 of reinforced substrate 702, opposite back contact layer 752. In an embodiment, stress relief layer 764 is formed of molybdenum or another inert metal.

A solar absorber layer 754 is formed on back contact layer 752. In an embodiment, solar absorber layer 754 is 2.0 μm thick and includes a copper based group I-III-VI material such as copper indium diselenide (CIS) and one or more silver based group I-III-VI materials such as silver indium diselenide (AIS). Solar absorber layer 754 may include alloys of CIS or AIS; such alloys for example include gallium, aluminum, sulfur and/or tellurium. Furthermore, alloys of CIS or AIS may include endpoint alloys without indium or selenium. In an embodiment, solar absorber layer 754 includes a copper-indium-gallium-diselenide (CIGS) material. As described above, e.g., with respect to substrate 402 and method 500, reinforced substrate 702 may tolerate high processing temperatures to allow deposition of solar absorber layer 754 at a high temperature (i.e., in excess of 500° C.), thereby increasing conversion efficiency of TFPV device 700. As known in the art, CIS-based solar absorber layers are best formed by heating at temperatures in excess of 500° C. for a period of 25 to 30 minutes.

A heterojunction partner or window layer 756 is formed on solar absorber layer 754. In an embodiment, window layer 756 is approximately 0.05 μm thick and includes cadmium sulfide, zinc sulfide, alloys of cadmium-zinc sulfide, zinc oxide, zinc hydroxide, zinc-magnesium oxide, magnesium hydroxide, or combinations thereof. Window layer 756 may also include indium selenide. Window layer 756 is typically applied by chemical bath deposition (CBD), but can also be applied by non-wet techniques such as sputtering, as discussed below.

An optional electrically insulating buffer layer 758 of an insulating oxide may be formed on window layer 756. In an embodiment, buffer layer 758 is 0.05 μm thick and includes an intrinsic zinc-oxide (i-ZnO), zinc-magnesium oxide alloy, zinc hydroxide, magnesium hydroxide, or combinations thereof.

A top electrode or contact layer 760 is formed on buffer layer 758 if a buffer layer is incorporated in TFPV device 700; otherwise top contact layer 760 is formed directly on window layer 756. Top contact layer 760 may include a semi transparent conducting oxide. In an embodiment, top contact layer 760 is 0.6 μm thick and includes a doped tin oxide, an undoped tin oxide, an indium-tin oxide (ITO) alloy, an undoped zinc oxide or a doped zinc-oxide using aluminum or gallium (ZnO:Al,Ga). An optional metallic grid (not illustrated in FIG. 7) may be formed on a top surface 762 of top contact layer 760. In an embodiment, the metallic grid includes a thin layer of Ni and a thicker layer of Al or Ag.

Thin film layers may be formed on a reinforced substrate to produce TFPV device 700 of FIG. 7 or TFPV devices 800 and 900 (discussed below), using a wide variety of deposition processes. Such deposition processes include, but are not limited to, a sputter plasma (RF, AC, DC and/or plasma assisted) process, an evaporation (thermal, electron beam, or cathodic arc) process, a chemical vapor deposition (low pressure, atmospheric pressure or plasma enhanced) process, a sublimation process, a physical vapor deposition process and/or a hot wire process. Exemplary deposition processes are discussed with respect to each thin film layer.

In an embodiment, a plasma cleaning step is performed prior to the back contact layer (e.g., back contact layer 752, 852, or 952) or an interface layer (e.g., interface layer 750, 850, or 950) being formed on a reinforced substrate (e.g., reinforced substrate 702). The plasma cleaning may be performed using a RF sputtering process under a pressure ranging from approximately twenty to five hundred millitorr in the presence of oxygen or air. By way of example and not of limitation, power sources for RF sputtering may range from approximately 100 to 500 Watts at a frequency of about 14 MHz from an approximately 182 square centimeter metal cathode.

A back contact layer (e.g., back contact layer 752) is for example formed on a reinforced substrate (e.g., reinforced substrate 702) or an interface layer (e.g., interface layer 750) using a DC sputtering process under a pressure ranging from approximately one to twenty millitorr. By way of example and not of limitation, power sources for DC sputtering may range from approximately 500 to 5,000 Watts on an approximately 60 square inches target. In an embodiment, a back contact layer of molybdenum formed on a reinforced substrate by sputtering has a thickness of 200 to 700 nm. Furthermore, as stated above, a back contact layer of molybdenum may include oxygen to alter its properties and reduce back contact cracking. Oxygen may be incorporated into the back contact layer during the sputter deposition process, as disclosed in Shafarman et al. at the Space Photovoltaic Research and Technology Conference at NASA Glenn in Cleveland, Ohio, United States of America, September, 2005.

In an embodiment, a solar absorber layer (e.g., solar absorber layer 754) having a thickness of 1 to 3 μm is formed on a back contact layer via thermal co-evaporation. Thermal co-evaporation may be conducted by a variety of methods known in the art, such as those disclosed in U.S. Pat. No. 5,441,897 to Noufi et al., or in U.S. Pat. No. 4,335,226 to Mickelsen et al.

A window layer (e.g., window layer 756) may be formed on a solar absorber layer via chemical bath deposition, chemical surface deposition or a non-wet process such as sputtering. The chemical bath deposition process may be accomplished by a variety of methods that are known in the art. For example, U.S. Pat. No. 6,537,845, to McCandless et al. discloses a method for applying a CdS bath solution on a solar absorber layer's surface. Also, as is known in the art, a CdS layer may be formed on a solar absorber layer by submersion into an aqueous chemical bath. In an embodiment, chemical bath constituents include a cadmium salt and/or zinc salt, $(NH_2)_2CS$ (which is commonly referred to as thiourea), a hydroxide agent and water. Exemplary salts include cadmium sulfate and zinc sulfate, and an example of the hydroxide agent is ammonium hydroxide ($NH_4OH$). The bath temperature is typically in the range of 60 to 85° C. The solar absorber layer's surface is first submersed into a solution containing the salt(s) and the hydroxide agent for a sufficient amount of time (e.g., 1 minute) for the reinforced substrate to reach a desired temperature. Thiourea is then applied to the substrate, and a chemical reaction is allowed to occur for several minutes. The reinforced substrate is removed from the chemical bath, and unreacted bath solution is rinsed away from the solar absorber layer's surface. The thickness of the resulting window layer film typically ranges from 10 to 100 nm.

In an embodiment, a buffer layer (e.g., optional buffer layer 758) is formed on a window layer using pulsed DC or RF sputtering under a pressure ranging from approximately one to twenty millitorr. By way of example and not of limitation, power sources for the pulsed DC sputtering may range from approximately 50 to 500 Watts on an approximately 60 square inches target. The buffer layer formed by such sputtering may be 10 to 100 nm thick.

In an embodiment, a top contact layer (e.g., top contact layer 760) is formed on a window layer or a buffer layer using pulsed DC sputtering under a pressure ranging from approximately one to twenty millitorr. By way of example and not of limitation, power sources for the pulsed DC sputtering may range from approximately 500 to 1,500 Watts on an approximately 60 square inches target. A typical film thickness of the top contact layer formed by such sputtering ranges from 200 to 500 nm.

Figure 8:
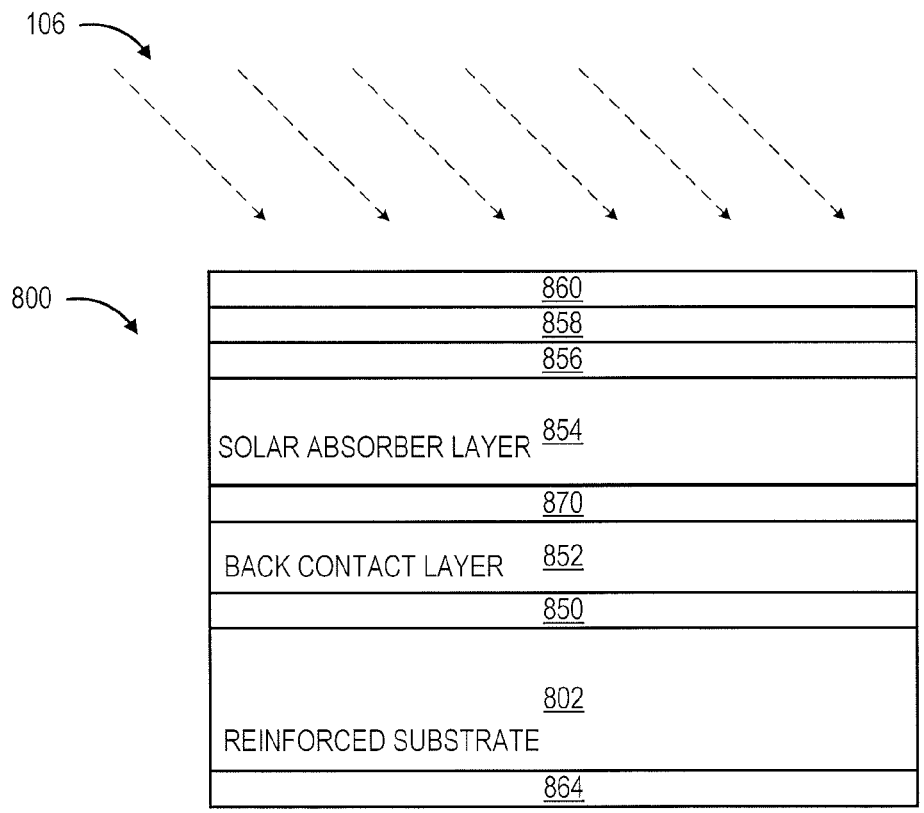
FIG. 8 is a mid sectional view of one TFPV device, according to an embodiment.

Additional embodiments of a TFPV device can be formed on a reinforced substrate. For example, FIG. 8 is a mid-sectional side view of a TFPV device 800 based on II-VI solar absorber materials and formed on a reinforced substrate 802. TFPV device 800 converts incident electromagnetic energy 106 into an electric current. Reinforced substrate 802 may be an embodiment of reinforced substrate 102, 202, 302, or 402. Although FIG. 8 illustrates a single TFPV device 800 formed on reinforced substrate 802, a plurality of TFPV devices 800 may (and likely would) be formed on reinforced substrate 802.

A solar absorber layer 854 is formed of II-VI based materials. Exemplary group II based materials include cadmium, zinc and magnesium; exemplary group VI based materials include sulfur, selenium and tellurium. In an embodiment, solar absorber layer 854 include cadmium telluride, alloys of cadmium telluride, cadmium selenide or alloys of cadmium selenide. In an embodiment of TFPV device 800, an optional stress relief layer 864, an optional interface layer 850, a back contact layer 852, a window layer 856, an optional buffer layer 858 and a top contact layer 860 correspond to layers 764, 750, 752, 756, 758 and 760 of TFPV device 700 of FIG. 7. An interface layer 870 may adjoin solar absorber layer 854 and back contact layer 852; however, interface layer 870 may be excluded such that back contact layer 852 directly adjoins solar absorber layer 854.

In one embodiment, both buffer layer 858 and top contact layer 860 are formed of tin oxide. Back contact interface layer 870 is for example formed of a doped ZnTe material, and is disposed between contact layer 852 and solar absorber layer 854. Additional details regarding including a back contact interface layer and forming both a top contact layer and a buffer layer of tin oxide are taught in Ilvydas Matulionis, Sijin Han, Jennifer A. Drayton, Kent J. Price and Alvin D. Compaan, Mat. Res. Soc. Symp. Proc. Vol. 668, p.H 8.23.1, April (2001), which is herein incorporated by reference in its entirety.

The characteristics of reinforced substrate 802 may enable deposition of solar absorber layer 854 at high temperatures (e.g., up to 600° C.), thereby enabling production of a high-efficiency TFPV device 800. In one embodiment, a high-temperature chemical treatment is applied to the junction materials (e.g., to solar absorber layer 854/window layer 856 heterojunctions) or solely to solar absorber layer 854. Such high temperature chemical treatment may be a wet or dry $CdCl_2$ application and subsequent application of high-temperatures (e.g., 350 to 450° C.) to reinforced substrate 802 with the $CdCl_2$ for a period of 5 to 30 minutes.

Figure 9:
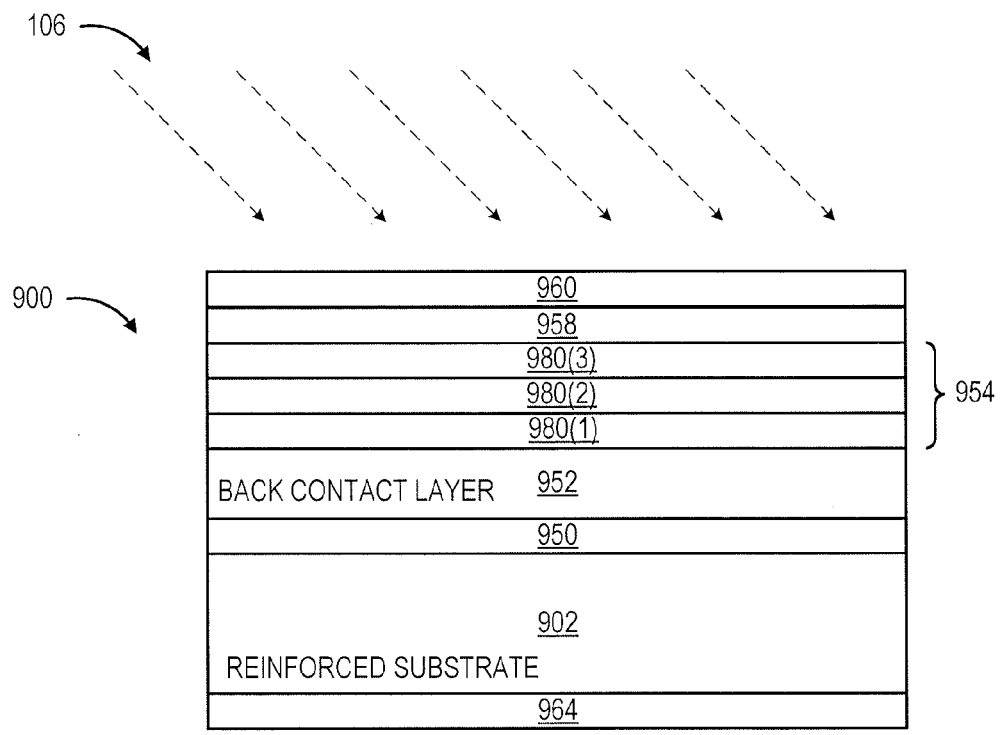
FIG. 9 is a mid sectional view of one TFPV device, according to an embodiment.

FIG. 9 illustrates another TFPV device formed on a reinforced substrate. Specifically, FIG. 9 is a mid-sectional side view of a TFPV device 900 formed on reinforced substrate 902. TFPV device 900 converts incident electromagnetic 106 energy into an electric current. Reinforced substrate 902 may be an embodiment of reinforced substrate 102, 202, 302, or 402. Although FIG. 9 illustrates a single TFPV device 900 formed on reinforced substrate 902, a plurality of TFPV devices may (and likely would) be formed on reinforced substrate 902.

TFPV device 900 includes a solar absorber layer 954 including amorphous-silicon based materials, micro-silicon based materials or their alloys with hydrogen and germanium. In one embodiment, TFPV device 900 is an amorphous-silicon based device and solar absorber layer 954 includes three sub layers 980(1), 980(2) and 980(3), forming a p-i-n structure. Tandem or multi-junction TFPV devices 900 may likewise be formed, by stacking multiple p-i-n solar absorber structures (not shown in FIG. 9) on top of one another, with each i-layer tuned to a different portion of the solar spectrum, preferably with increasing bandgap in the direction of incident electromagnetic energy 106.

TFPV device 900 does not include a window layer—a window layer is not needed in TFPV device 900 due to the junction formed by the p-i-n structure of solar absorber layer 954. An optional stress relief layer 964, an optional interface layer 950 and an optional buffer layer 958 generally correspond with layers 764, 750 and 758 of TFPV device 700, FIG. 7. A back contact layer 952 generally corresponds with back contact layer 752, except that back contact layer 952 is commonly formed of aluminum or silver. A top contact layer 960 generally corresponds with top contact layer 760, except that top contact layer 960 is commonly formed of a doped tin oxide material.

Figure 10:
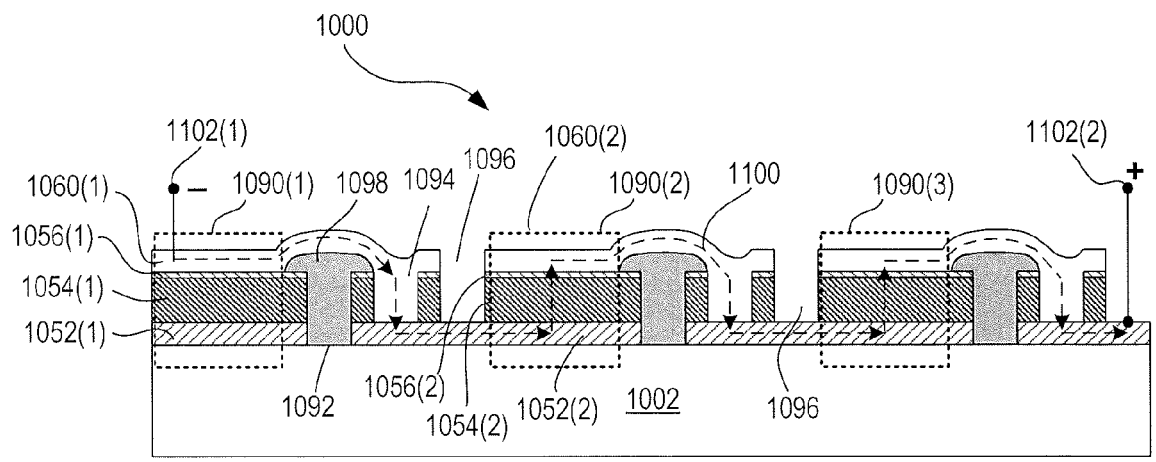
FIG. 10 is a mid sectional view of one array of TFPV devices monolithically integrated onto a common reinforced substrate, according to an embodiment.

As previously noted, a plurality of TFPV devices may be monolithically integrated onto a common reinforced substrate. FIG. 10 is a mid-sectional view of an array 1000 of TFPV devices monolithically integrated onto a reinforced substrate 1002. Array 1000 is illustrated in FIG. 10 as having three TFPV devices 1090(1), 1090(2) and 1090(3); however, array 1000 can have any quantity of TFPV devices. Array 1000 is for example used in a solar power array. Reinforced substrate 1002 may be an embodiment of reinforced substrate 102, 202, 302 or 402.

Each TFPV device 1090 is separated from one or more adjacent TFPV devices 1090 by scribes 1096 (also referred to as "third scribes 1096"). Each TFPV device 1090 includes a section of back contact layer 1052, solar absorber layer 1054, window layer 1056 and top contact layer 1060. For example, TFPV device 1090(1) includes a back contact layer 1052(1), a solar absorber layer 1054(1), a window layer 1056(1) and a top contact layer 1060(1). Each TFPV device 1090 further includes a first scribe 1092 down to reinforced substrate 1002; each first scribe 1092 is filled with resistive filler 1098 to enable the first scribe to provide electrical isolation. By way of example and not of limitation, the resistive filler is a resistive ink or oxide.

TFPV devices 1090 may be electrically connected in parallel, series, or combinations thereof. Furthermore, one or more TFPV devices 1090 may be at least partially electrically isolated from one or more other TFPV devices 1090.

FIG. 10 illustrates TFPV devices 1090 electrically connected in series. As shown in FIG. 10, electric current enters array 1000 at a terminal 1102(1) and exits array 1000 at a terminal 1102(2). In particular, electric current 1100 enters array 1000 via terminal 1102(1). Electric current 1100 flows from terminal 1102(1) along the top of a TFPV device 1090 (1) via a top contact layer 1060(1). Electric current 1100 then flows from top contact layer 1060(1) to a back contact layer 1052(2) via a second scribe 1094 which is filled with the conductive material used to form top contact layer 1060. Electric current 1100 flows through back contact layer 1052 (2) to the next TFPV device 1090(2). Electric current 1100 then flows from back contact layer 1052(2) to a top contact layer 1060(2) via a solar absorber layer 1054(2) and a window layer 1056(2). Electric current 1100 continues to flow through the remainder of photovoltaic device 1090(2) in the same manner as in photovoltaic device 1090(1,) and then flows through a photovoltaic device 1090(3) in the same manner as in photovoltaic device 1090(2). Electric current 1100 finally exits array 1000 via terminal 1102(2).

Additional embodiments of array 1000 may be formed where TFPV devices 1090 include one or more features of TFPV devices 700, 800 and/or 900 discussed above. For example, TFPV devices 1090 may include an interface layer, a stress relief layer and/or a buffer layer. In another example, solar absorber layer 1054 may form a p-i-n structure. Likewise, each TFPV device 1090 may include a plurality of junctions as discussed above with respect to FIG. 9.

Figure 11:
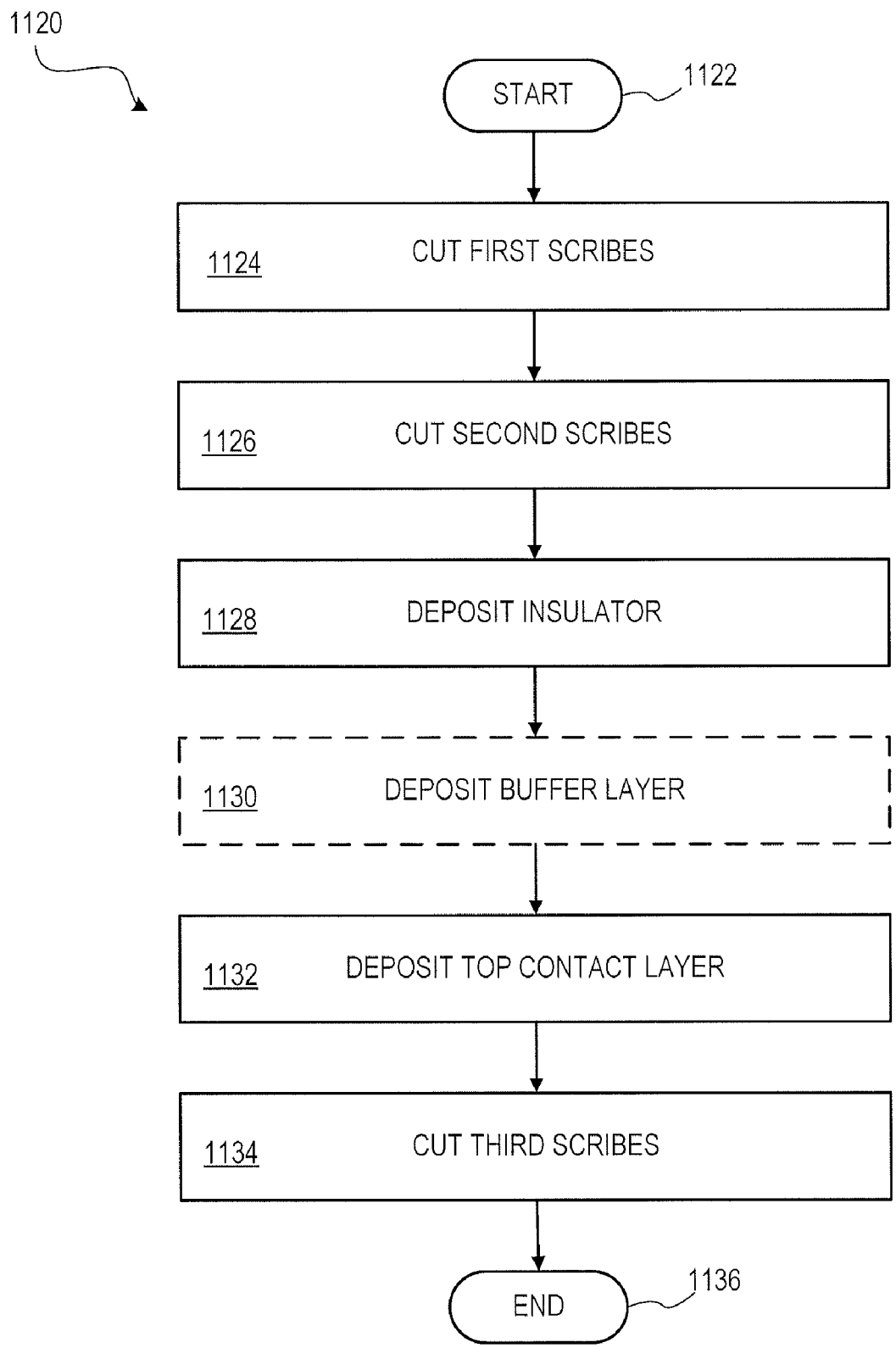
FIG. 11 is a flow chart of one process of producing an array of TFPV devices monolithically integrated onto a common reinforced substrate, according to an embodiment.

FIG. 11 is a flow chart of a process 1120 of producing an array of TFPV devices monolithically integrated onto a reinforced substrate. Process 1120 is for example used to produce array 1000 of FIG. 10. In process 1120, a series of scribing and printing operations are interspersed with the thin-film layer deposition operations described above, to form a sequence of 'monolithically interconnected' photovoltaic devices on a single section of reinforced substrate.

Process 1120 starts 1122 and proceeds to step 1124 wherein first scribes are cut in a stack of thin film layers formed on a reinforced substrate (e.g., reinforced substrate 102, 202, 302, or 402). The stack of thin film layers includes at least a back contact layer (e.g., layers 752, 852 or 952 of FIGS. 7-9, respectively) and a solar absorber layer or layers (e.g., layers 754, 854 or 954 of FIGS. 7-9, respectively). The stack of thin film layers may optionally include additional layers including a stress relief layer (e.g., layers 764, 864 or 964 of FIGS. 7-9, respectively), an interface layer (e.g., layers 750, 850 or 950 of FIGS. 7-9, respectively), a back contact interface layer (e.g., layer 870 of FIG. 8), a window layer (e.g., layers 756 and 856 of FIGS. 7-8, respectively) and/or a buffer layer (e.g., layers 758, 858 or 958 of FIGS. 7-9, respectively). The first scribes are cut through all deposited layers exposing the top of the bare, uncoated reinforced substrate, to functionally divide the deposited thin layers into plural individual segments and thereby isolate each segment electrically. The segments are held together by the reinforced substrate, which remains intact. The scribing technique used is a matter of design choice. In one embodiment, scribing is accomplished using a high power density laser. In one example of step 1124, first scribes 1092 of array 1000 (FIG. 10) are laser-cut through top contact layer 1060, window layers 1056, solar absorber layer 1054 and back contact layer 1052 to expose substrate 1002.

In step 1126, second scribes are cut in the stack of thin film layers formed on the reinforced substrate adjacent to the first scribes. In contrast to the first scribes, the second scribes are only cut down to the top surface of the deposited back contact layer. The second scribes form a via, or a channel, which will later be filled with a conductive oxide or other top conductor material. In one example of step 1126, second scribes 1094 of array 1000 (FIG. 10) are laser-cut through top contact layer 1060, window layer 1056 and solar absorber layer 1054 to expose the surface of back contact layer 1052.

To prevent the conductive oxide that will later be applied as the top contact layer from 'filling in' the first scribes (e.g., scribes 1092) and in effect reconnecting adjacent, electrically divided segments, the first scribe are filled with an insulator, in step 1128. Step 1128 is for example executed by depositing a UV curable ink using a commercially adapted ink jet dispense head that is coincident with the high power density laser used to cut the first scribes. In one example of step 1128, first scribes 1092 of array 1000 (FIG. 10) are filled with resistive filler 1098.

In optional step 1130, an electrically insulating buffer layer is deposited on the top of the window layer, or the solar absorber layer if a window layer is not deposited. The buffer layer is for example an intrinsic-zinc-oxide (i-ZnO) layer. It should be noted that in other embodiments of process 1120, a buffer layer may already be deposited on the solar absorber layer or the window layer before the start of process 1120, or a buffer layer may be deposited on the solar absorber layer or the window layer between steps 1124 and 1126. A window layer may optionally be deposited on the solar absorber layer before the start of process 1120, between steps 1124 and 1126 and/or as an additional part of step 1130.

In step 1132, a top contact layer is deposited on the top surface of the top thin film layer of the stack. The top thin film layer may be a window layer, a buffer layer, or a solar absorber layer. In one example of step 1132, top contact layer 1060 is deposited on window layer 1056 of array 1000 of FIG. 10.

In step 1134, third scribes are cut in the stack of thin film layers. Like the second scribes, the third scribes are cut down to the top surface of the deposited back contact layer. The third scribes provide electrical isolation to complete formation of an array of TFPV devices. In one example of step 1134, third scribes 1096 are laser cut through top contact layer 1060, window layer 1056 and solar absorber layer 1054 of array 1000, electrically isolating photovoltaic devices 1090(1), 1090(2) and 1090(3) of FIG. 10. Process 1120 ends 1136 after step 1134.

As stated above, a base material of a reinforced substrate (e.g., base materials 210, 310 and 410) may be a silicone composition. In one embodiment, the silicone composition is a hydrosilylation-curable silicone composition including a silicone resin (A), an organosilicon compound (B) and a hydrosilylation catalyst (C). The silicone resin (A) has silicon-bonded alkenyl groups or silicon-bonded hydrogen atoms. The silicone resin (A) is typically a copolymer including $R^2SiO_{3/2}$ units, i.e., T units and/or $SiO_{4/2}$ units, i.e., Q units, in combination with $R^1R^2{}_2SiO_{3/2}$ units, i.e., M units and/or $R^2{}_2SiO_{2/2}$ units, i.e., D units, wherein $R^1$ is a $C_1$ to $C_{10}$ hydrocarbyl group or a $C_1$ to $C_{10}$ halogen-substituted hydrocarbyl group, both free of aliphatic unsaturation, and $R^2$ is $R^1$, an alkenyl group or hydrogen. For example, the silicone resin can be a DT resin, an MT resin, an MDT resin, a DTQ resin, an MTQ resin, an MDTQ resin, a DQ resin, an MQ resin, a DTQ resin, an MTQ resin or an MDQ resin. As used herein, the phrase "free of aliphatic unsaturation" means the hydrocarbyl or halogen-substituted hydrocarbyl group does not contain an aliphatic carbon-carbon double bond or carbon-carbon triple bond.

The $C_1$ to $C_{10}$ hydrocarbyl group and $C_1$ to $C_{10}$ halogen-substituted hydrocarbyl group represented by $R^1$ more typically have from 1 to 6 carbon atoms. Acyclic hydrocarbyl and halogen-substituted hydrocarbyl groups containing at least 3 carbon atoms can have a branched or unbranched structure. Examples of hydrocarbyl groups represented by $R^1$ include, but are not limited to: alkyl groups, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, octyl, nonyl and decyl; cycloalkyl groups, such as cyclopentyl, cyclohexyl and methylcyclohexyl; aryl groups, such as phenyl and naphthyl; alkaryl groups, such as tolyl and xylyl, and aralkyl groups, such as benzyl and phenethyl. Examples of halogen-substituted hydrocarbyl groups represented by $R^1$ include, but are not limited to: 3,3,3-trifluoropropyl, 3-chloropropyl, chlorophenyl, dichlorophenyl, 2,2,2-trifluoroethyl, 2,2,3,3-tetrafluoropropyl and 2,2,3,3,4,4,5,5-octafluoropentyl.

The alkenyl groups represented by $R^2$, which may be the same or different within the silicone resin, typically have from 2 to 10 carbon atoms (alternatively from 2 to 6 carbon atoms) and are exemplified by, but are not limited to: vinyl, allyl, butenyl, hexenyl and octenyl. In one embodiment, $R^2$ is predominantly the alkenyl group. In this embodiment, typically at least 50 mol %, alternatively at least 65 mol %, alternatively at least 80 mol %, of the groups represented by $R^2$ in the silicone resin are alkenyl groups. As used herein, the mol % of alkenyl groups in $R^2$ is defined as a ratio of the number of moles of silicon-bonded alkenyl groups in the silicone resin to the total number of moles of the $R^2$ groups in the resin, multiplied by 100. In another embodiment, $R^2$ is predominantly hydrogen. In this embodiment, typically at least 50 mol %, alternatively at least 65 mol %, alternatively at least 80 mol %, of the groups represented by $R^2$ in the silicone resin are hydrogen. The mol % of hydrogen in $R^2$ is defined as a ratio of the number of moles of silicon-bonded hydrogen in the silicone resin to the total number of moles of the $R^2$ groups in the resin, multiplied by 100.

According to a first embodiment, the silicone resin (A) has the formula:

$$(R^1R^2{}_2SiO_{1/2})_w(R^2{}_2SiO_{2/2})_x(R^2SiO_{3/2})_y(SiO_{4/2})_z \quad (I)$$

wherein $R^1$ and $R^2$ are as described and exemplified above and w, x, y and z are mole fractions. Typically, the silicone resin represented by formula (I) has an average of at least two silicon-bonded alkenyl groups per molecule. More specifically, the subscript w typically has a value of from 0 to 0.9, alternatively from 0.02 to 0.75, alternatively from 0.05 to 0.3. The subscript x typically has a value of from 0 to 0.9, alternatively from 0 to 0.45, alternatively from 0 to 0.25. The subscript y typically has a value of from 0 to 0.99, alternatively from 0.25 to 0.8, alternatively from 0.5 to 0.8. The subscript z typically has a value of from 0 to 0.85, alternatively from 0 to 0.25, alternatively from 0 to 0.15. Also, the ratio y+z/(w+x+y+z) is typically from 0.1 to 0.99, alternatively from 0.5 to 0.95, alternatively from 0.65 to 0.9. Further, the ratio w+x/(w+x+y+z) is typically from 0.01 to 0.90, alternatively from 0.05 to 0.5, alternatively from 0.1 to 0.35.

When $R^2$ is predominantly the alkenyl group, specific examples of silicone resins represented by formula (I) above include, but are not limited to, resins having the following formulae:

$(Vi_2MeSiO_{1/2})_{0.25}(PhSiO_{3/2})_{0.75}$, $(ViMe_2SiO_{1/2})_{0.25}(PhSiO_{3/2})_{0.75}$, $(ViMe_2SiO_{1/2})_{0.25}(MeSiO_{3/2})_{0.25}(PhSiO_{3/2})_{0.50}$, $(ViMe_2SiO_{1/2})_{0.15}(PhSiO_{3/2})_{0.75}(SiO_{4/2})_{0.1}$, and $(Vi_2MeSiO_{1/2})_{0.15}(ViMe_2SiO_{1/2})_{0.1}(PhSiO_{3/2})_{0.75}$, wherein Me is methyl, Vi is vinyl, Ph is phenyl, and the numerical subscripts outside the parenthesis denote mole fractions corresponding to either w, x, y, or z as described above for formula (I). The sequence of units in the preceding formulae is not to be viewed in any way as limiting to the scope of this disclosure.

When $R^2$ is predominantly hydrogen, specific examples of silicone resins represented by formula (I) above include, but are not limited to, resins having the following formulae:

$(HMe_2SiO_{1/2})_{0.25}(PhSiO_{3/2})_{0.75}$, $(HMeSiO_{2/2})_{0.3}(PhSiO_{3/2})_{0.6}(MeSiO_{3/2})_{0.1}$, and $(Me_3SiO_{1/2})_{0.1}(H_2SiO_{2/2})_{0.1}(MeSiO_{3/2})_{0.4}(PhSiO_{3/2})_{0.4}$, wherein Me is methyl, Ph is phenyl, and the numerical subscripts outside the parenthesis denote mole fractions. The sequence of units in the preceding formulae is not to be viewed in any way as limiting to the scope of this disclosure.

The silicone resin represented by formula (I) typically has a number-average molecular weight ($M_n$) of from 500 to 50,000, alternatively from 500 to 10,000, alternatively 1,000 to 3,000, where the molecular weight is determined by gel permeation chromatography employing a low angle laser light scattering detector, or a refractive index detector and silicone resin (MQ) standards.

The viscosity of the silicone resin represented by formula (I) at 25° C. is typically from 0.01 to 100,000 Pa·s, alternatively from 0.1 to 10,000 Pa·s, alternatively from 1 to 100 Pa·s.

The silicone resin represented by formula (I) typically includes less than 10% (w/w), alternatively less than 5% (w/w), alternatively less than 2% (w/w), of silicon-bonded hydroxy groups, as determined by $^{29}Si$ NMR.

Methods of preparing silicone resins represented by formula (I) are well known in the art; many of these resins are commercially available. Silicone resins represented by formula (I) are typically prepared by cohydrolyzing the appropriate mixture of chlorosilane precursors in an organic solvent, such as toluene. For example, a silicone resin including $R^1R^2{}_2SiO_{1/2}$ units and $R^2SiO_{3/2}$ units can be prepared by cohydrolyzing a first compound having the formula $R^1R^2{}_2SiCl$ and a second compound having the formula $R^2SiCl_3$ in toluene, where $R^1$ and $R^2$ are as defined and exemplified above, to form aqueous hydrochloric acid and the silicone resin, which is a hydrolyzate of the first and second compounds. The aqueous hydrochloric acid and the silicone resin are separated, the silicone resin is washed with water to remove residual acid, and the silicone resin is heated in the presence of a mild condensation catalyst to "body" the silicone resin to a desired viscosity.

If desired, the silicone resin can be further treated with a condensation catalyst in an organic solvent to reduce the content of silicon-bonded hydroxy groups. Alternatively, first or second compounds containing hydrolysable groups other than chloro groups, such as —Br, —I, —OCH$_3$, —OC(O)CH$_3$, —N(CH$_3$)$_2$, NHCOCH$_3$ and —SCH$_3$, can be cohydrolyzed to form the silicone resin. The properties of the silicone resin depend on the types of first and second compounds, the mole ratio of first and second compounds, the degree of condensation and the processing conditions.

The hydrosilylation-curable silicone composition further includes a cross-linking agent (B) having silicon-bonded hydrogen atoms or silicon-bonded alkenyl groups capable of reacting with the silicon-bonded alkenyl groups or silicon-bonded hydrogen atoms in the silicone resin. The cross-linking agent (B) has an average of at least two silicon-bonded hydrogen atoms per molecule, alternatively at least three silicon-bonded hydrogen atoms per molecule. It is generally understood that cross-linking occurs when the sum of the average number of alkenyl groups per molecule in the silicone resin (A) and the average number of silicon-bonded hydrogen atoms per molecule in the cross-linking agent (B) is greater than four. The cross-linking agent (B) is present in an amount sufficient to cure the silicone resin (A).

The cross-linking agent (B) is typically an organosilicon compound and may be further defined as an organohydrogensilane, an organohydrogensiloxane, or a combination thereof. The structure of the organosilicon compound can be linear, branched, cyclic, or resinous. In acyclic polysilanes and polysiloxanes, the silicon-bonded hydrogen atoms can be located at terminal, pendant, or at both terminal and pendant positions. Cyclosilanes and cyclosiloxanes typically have from 3 to 12 silicon atoms, alternatively from 3 to 10 silicon atoms, alternatively from 3 to 4 silicon atoms.

The organohydrogensilane can be a monosilane, disilane, trisilane, or polysilane. When R$^2$ is predominantly the alkenyl group, specific examples of organohydrogensilanes that are suitable for purposes of the present invention include, but are not limited to, diphenylsilane, 2-chloroethylsilane, bis[(p-dimethylsilyl)phenyl]ether, 1,4-dimethyldisilylethane, 1,3,5-tris(dimethylsilyl)benzene, 1,3,5-trimethyl-1,3,5-trisilane, poly(methylsilylene)phenylene and poly(methylsilylene)m-ethylene. When R$^2$ is predominantly hydrogen, specific examples of organohydrogensilanes that are suitable for purposes of the present invention include, but are not limited to, silanes having the following formulae:

Vi$_4$Si, PhSiVi$_3$, MeSiVi$_3$, PhMeSiVi$_2$, Ph$_2$SiVi$_2$ and PhSi(CH$_2$CH=CH$_2$)$_3$, wherein Me is methyl, Ph is phenyl and Vi is vinyl.

The organohydrogensilane can also have the formula:

HR$^1_2$Si—R$^3$—SiR$^1_2$H    (III)

wherein R$^1$ is as defined and exemplified above and R$^3$ is a hydrocarbylene group free of aliphatic unsaturation having a formula selected from the following structures:

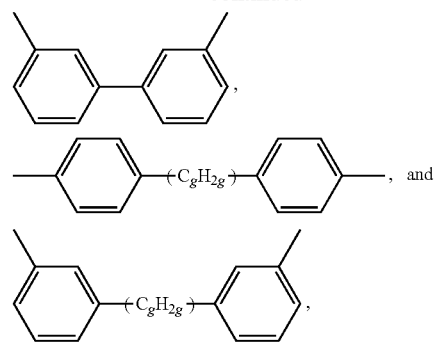

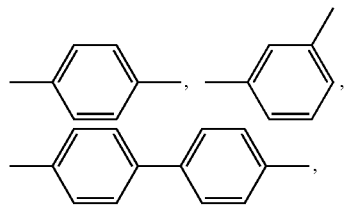

wherein g is from 1 to 6.

Specific examples of organohydrogensilanes having the formula (III), wherein R$^1$ and R$^3$ are as described and exemplified above include, but are not limited to, organohydrogensilanes having a formula selected from the following structures:

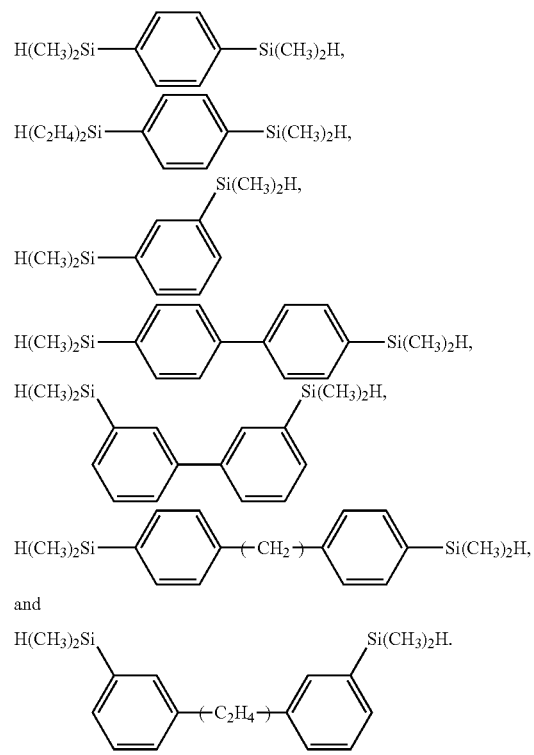

Methods of preparing the organohydrogensilanes are known in the art. For example, organohydrogensilanes can be prepared by reaction of Grignard reagents with alkyl or aryl halides. In particular, organohydrogensilanes having the formula HR$^1_2$Si—R$^3$—SiR$^1_2$H can be prepared by treating an aryl dihalide having the formula R$^3$X$_2$ with magnesium in ether to produce the corresponding Grignard reagent and then treating the Grignard reagent with a chlorosilane having the formula HR$^1_2$SiCl, where R$^1$ and R$^3$ are as described and exemplified above.

The organohydrogensiloxane can be a disiloxane, trisiloxane, or polysiloxane. Examples of organosiloxanes suitable for use as the cross-linking agent (B) when $R^2$ is predominantly hydrogen include, but are not limited to, siloxanes having the following formulae:

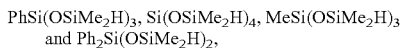

wherein Me is methyl and Ph is phenyl.

Specific examples of organohydrogensiloxanes that are suitable for purposes of the present invention when $R^2$ is predominantly alkenyl group include, but are not limited to, 1,1,3,3-tetramethyldisiloxane, 1,1,3,3-tetraphenyldisiloxane, phenyltris(dimethylsiloxy)silane, 1,3,5-trimethylcyclotrisiloxane, a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane) and a resin including $HMe_2SiO_{1/2}$ units, $Me_3SiO_{1/2}$ units and $SiO_{4/2}$ units, wherein Me is methyl.

The organohydrogensiloxane can also be an organohydrogenpolysiloxane resin. The organohydrogenpolysiloxane resin is typically a copolymer including $R^4SiO_{3/2}$ units, i.e., T units and/or $SiO_{4/2}$ units, i.e., Q units, in combination with $R^1R^4_2SiO_{1/2}$ units, i.e., M units, and/or $R^4_2SiO_{2/2}$ units, i.e., D units, wherein $R^1$ is as described and exemplified above. For example, the organohydrogenpolysiloxane resin can be a DT resin, an MT resin, an MDT resin, a DTQ resin, an MTQ resin, an MDTQ resin, a DQ resin, an MQ resin, a DTQ resin, an MTQ resin, or an MDQ resin.

The group represented by $R^4$ is either $R^1$ or an organosilylalkyl group having at least one silicon-bonded hydrogen atom. Examples of organosilylalkyl groups represented by $R^4$ include, but are not limited to, groups having a formula selected from the following structures:

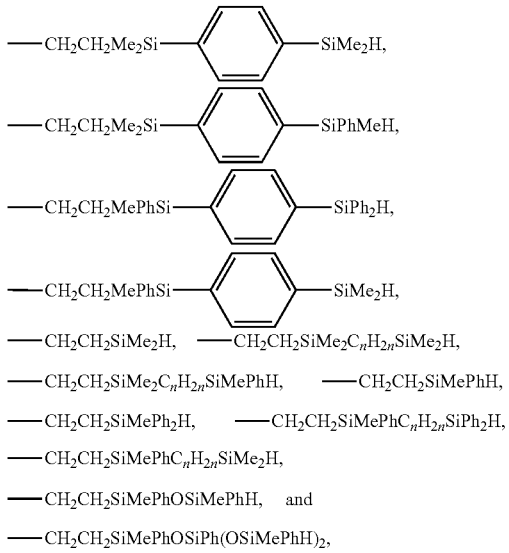

wherein Me is methyl, Ph is phenyl, and the subscript n has a value of from 2 to 10. Typically, at least 50 mol %, alternatively at least 65 mol %, alternatively at least 80 mol % of the groups represented by $R^4$ in the organohydrogenpolysiloxane resin are organosilylalkyl groups having at least one silicon-bonded hydrogen atom. As used herein, the mol % of organosilylalkyl groups in $R^4$ is defined as a ratio of the number of moles of silicon-bonded organosilylalkyl groups in the silicone resin to the total number of moles of the $R^4$ groups in the resin, multiplied by 100.

The organohydrogenpolysiloxane resin typically has the formula:

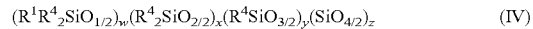

wherein $R^1$, $R^4$, w, x, y and z are each as defined and exemplified above.

Specific examples of organohydrogenpolysiloxane resins represent by formula (IV) above include, but are not limited to, resins having the following formulae:

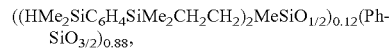

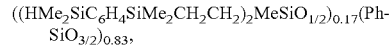

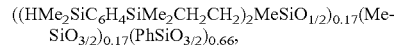

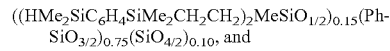

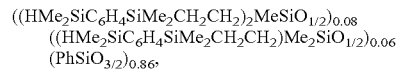

wherein Me is methyl, Ph is phenyl, $C_6H_4$ denotes a paraphenylene group, and the numerical subscripts outside the parenthesis denote mole fractions. The sequence of units in the preceding formulae is not to be viewed in any way as limiting to the scope of the invention.

Specific examples of organohydrogenpolysiloxane resins include, but are not limited to, resins having the following formulae:

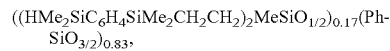

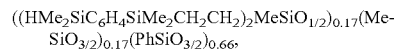

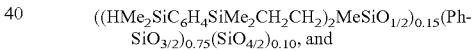

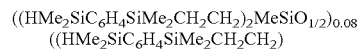

$Me_2SiO_{1/2})_{0.06}(PhSiO_{3/2})_{0.86}$, where Me is methyl, Ph is phenyl, $C_6H_4$ denotes a paraphenylene group, and the numerical subscripts outside the parenthesis denote mole fractions. The sequence of units in the preceding formulae is not to be viewed in any way as limiting to the scope of this disclosure.

The organohydrogenpolysiloxane resin having the formula (IV) can be prepared by reacting a reaction mixture including (a) a silicone resin having the formula $(R^1, R^2_2SiO_{1/2})_w$ $(R^2_2SiO_{2/2})_x(R^2SiO_{3/2})_y(SiO_{4/2})_z$ represented by formula (I) above and an organosilicon compound (b) having an average of from two to four silicon-bonded hydrogen atoms per molecule and a molecular weight of less than 1,000, in the presence of (c) a hydrosilylation catalyst and, optionally, (d) an organic solvent, wherein $R^1$, $R^2$, w, x, y and z are each as defined and exemplified above, provided the silicone resin (a) has an average of at least two silicon-bonded alkenyl groups per molecule, and the mole ratio of silicon-bonded hydrogen atoms in (b) to alkenyl groups in (a) is from 1.5 to 5. Silicone resin (a) can be the same as or different than the specific silicone resin used as component (A) in the hydrosilylation-curable silicone composition.

As set forth above, organosilicon compound (b) has an average of from two to four silicon-bonded hydrogen atoms per molecule. Alternatively, the organosilicon compound (b) has an average of from two to three silicon-bonded hydrogen atoms per molecule. As also set forth above, the organosilicon compound (b) typically has a molecular weight less than 1,000, alternatively less than 750, alternatively less than 500. The organosilicon compound (b) further includes silicon-bonded organic groups that may be selected from the group of hydrocarbyl groups and halogen-substituted hydrocarbyl groups, both free of aliphatic unsaturation, which are as described and exemplified above for $R^1$.

Organosilicon compound (b) can be an organohydrogensilane or an organohydrogensiloxane, each of which are defined and exemplified in detail above.

Organosilicon compound (b) can be a single organosilicon compound or a mixture comprising two or more different organosilicon compounds, each as described above. For example, organosilicon compound (B) can be a single organohydrogensilane, a mixture of two different organohydrogensilanes, a single organohydrogensiloxane, a mixture of two different organohydrogensiloxanes, or a mixture of an organohydrogensilane and an organohydrogensiloxane. The mole ratio of silicon-bonded hydrogen atoms in organosilicon compound (b) to alkenyl groups in silicone resin (a) is typically from 1.5 to 5, alternatively from 1.75 to 3, alternatively from 2 to 2.5.

Hydrosilylation catalyst (c) can be any of the well-known hydrosilylation catalysts comprising a platinum group metal (i.e., platinum, rhodium, ruthenium, palladium, osmium and iridium) or a compound containing a platinum group metal. Typically, the platinum group metal is platinum, based on its high activity in hydrosilylation reactions.

Specific hydrosilylation catalysts suitable for (c) include the complexes of chloroplatinic acid and certain vinyl-containing organosiloxanes disclosed by Willing in U.S. Pat. No. 3,419,593, the portions of which address hydrosilylation catalysts are hereby incorporated by reference. A catalyst of this type is the reaction product of chloroplatinic acid and 1,3-diethenyl-1,1,3,3-tetramethyldisiloxane.

The hydrosilylation catalyst can also be a supported hydrosilylation catalyst comprising a solid support having a platinum group metal on the surface thereof. A supported catalyst can be conveniently separated from the organohydrogenpolysiloxane resin represented by formula (IV), for example, by filtering the reaction mixture. Examples of supported catalysts include, but are not limited to, platinum on carbon, palladium on carbon, ruthenium on carbon, rhodium on carbon, platinum on silica, palladium on silica, platinum on alumina, palladium on alumina and ruthenium on alumina.

The concentration of hydrosilylation catalyst (c) is sufficient to catalyze the addition reaction of silicone resin (a) with organosilicon compound (b). Typically, the concentration of hydrosilylation catalyst (c) is sufficient to provide from 0.1 to 1000 ppm of a platinum group metal, alternatively from 1 to 500 ppm of a platinum group metal, alternatively from 5 to 150 ppm of a platinum group metal, based on the combined weight of silicone resin (a) and organosilicon compound (b). The rate of reaction is very slow below 0.1 ppm of platinum group metal. The use of more than 1000 ppm of platinum group metal results in no appreciable increase in reaction rate, and is therefore uneconomical.

Organic solvent (d) includes at least one organic solvent. The organic solvent (d) can be any aprotic or dipolar aprotic organic solvent that does not react with silicone resin (a), organosilicon compound (b), or the resulting organohydrogenpolysiloxane resin under the conditions of the present method, and is miscible with components (a), (b) and the organohydrogenpolysiloxane resin.

Examples of organic solvents (d) that are suitable for purposes of the present invention include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, toluene, xylene and mesitylene; cyclic ethers such as tetrahydrofuran (THF) and dioxane; ketones such as methyl isobutyl ketone (MIBK); halogenated alkanes such as trichloroethane; and halogenated aromatic hydrocarbons such as bromobenzene and chlorobenzene. Organic solvent (d) can be a single organic solvent or a mixture comprising two or more different organic solvents, each as described above. The concentration of organic solvent (d) is typically from 0 to 99% (w/w), alternatively from 30 to 80% (w/w), alternatively from 45 to 60% (w/w), based on the total weight of the reaction mixture.

The reaction to form the organohydrogenpolysiloxane resin represented by formula (IV) can be carried out in any standard reactor suitable for hydrosilylation reactions. Suitable reactors include glass and Teflon-lined glass reactors. Typically, the reactor is equipped with a means of agitation, such as stirring. Also, typically, the reaction is carried out in an inert atmosphere, such as nitrogen or argon, in the absence of moisture.

The silicone resin (a), organosilicon compound (b), hydrosilylation catalyst (c) and, optionally, organic solvent (d), can be combined in any order. Typically, organosilicon compound (b) and hydrosilylation catalyst (c) are combined before the introduction of the silicone resin (a) and, optionally, organic solvent (d). The reaction is typically carried out at a temperature of from 0 to 150° C., alternatively from room temperature (~23±2° C.) to 115° C. When the temperature is less than 0° C., the rate of reaction is typically very slow. The reaction time depends on several factors, such as the structures of the silicone resin (a) and the organosilicon compound (b), and the temperature. The time of reaction is typically from 1 to 24 h at a temperature of from room temperature (~23±2° C.) to 150° C. The optimum reaction time can be determined by routine experimentation.

The organohydrogenpolysiloxane resin represented by formula (IV) can be used without isolation or purification or the organohydrogenpolysiloxane resin can be separated from most of the organic solvent (d) by conventional methods of evaporation. For example, the reaction mixture can be heated under reduced pressure. Moreover, when the hydrosilylation catalyst (c) is a supported catalyst, as described above, the organohydrogenpolysiloxane resin can be readily separated from the hydrosilylation catalyst (c) by filtering the reaction mixture. However, the hydrosilylation catalyst may remain mixed with the organohydrogenpolysiloxane resin and be used as hydrosilylation catalyst (C).

The cross-linking agent (B) can be a single organosilicon compound or a mixture comprising two or more different organosilicon compounds, each as described above. For example, the cross-linking agent (B) can be a single organohydrogensilane, a mixture of two different organohydrogensilanes, a single organohydrogensiloxane, a mixture of two different organohydrogensiloxanes, or a mixture of an organohydrogensilane and an organohydrogensiloxane. In particular, the cross-linking agent (B) can be a mixture comprising the organohydrogenpolysiloxane resin having the formula (IV) in an amount of at least 0.5% (w/w), alternatively at least 50% (w/w), alternatively at least 75% (w/w), based on the total weight of the cross-linking agent (B), with the cross-linking agent (B) further comprising an organohydrogensilane and/or organohydrogensiloxane, the latter different from the organohydrogenpolysiloxane resin.

The concentration of cross-linking agent (B) is sufficient to cure (cross-link) the silicone resin (A). The exact amount of cross-linking agent (B) depends on the desired extent of cure. The concentration of cross-linking agent (B) is typically sufficient to provide from 0.4 to 2 moles of silicon-bonded hydrogen atoms, alternatively from 0.8 to 1.5 moles of silicon-bonded hydrogen atoms, alternatively from 0.9 to 1.1 moles of silicon-bonded hydrogen atoms, per mole of alkenyl groups in silicone resin (A).

Hydrosilylation catalyst (C) includes at least one hydrosilylation catalyst that promotes the reaction between silicone resin (A) and cross-linking agent (B). In one embodiment, the hydrosilylation catalyst (C) may be the same as the hydrosilylation catalyst (c) described above for producing the organohydrogenpolysiloxane resin. In addition, the hydrosilylation catalyst (C) can also be a microencapsulated platinum group metal-containing catalyst comprising a platinum group metal encapsulated in a thermoplastic resin. Hydrosilylation-curable silicone compositions including microencapsulated hydrosilylation catalysts are stable for extended periods of time, typically several months or longer, under ambient conditions, yet cure relatively rapidly at temperatures above the melting or softening point of thermoplastic resin(s). Microencapsulated hydrosilylation catalysts and methods of preparing them are well known in the art, as exemplified in U.S. Pat. No. 4,766,176 and the references cited therein, and U.S. Pat. No. 5,017,654. The hydrosilylation catalyst (C) can be a single catalyst or a mixture comprising two or more different catalysts that differ in at least one property, such as structure, form, platinum group metal, complexing ligand and thermoplastic resin.

In another embodiment, the hydrosilylation catalyst (C) may be at least one photoactivated hydrosilylation catalyst. The photoactivated hydrosilylation catalyst can be any hydrosilylation catalyst capable of catalyzing the hydrosilylation of the silicone resin (A) and the cross-linking agent (B) upon exposure to radiation having a wavelength of from 150 to 800 nm. The photoactivated hydrosilylation catalyst can be any of the well-known hydrosilylation catalysts comprising a platinum group metal or a compound containing a platinum group metal. The platinum group metals include platinum, rhodium, ruthenium, palladium, osmium and iridium. Typically, the platinum group metal is platinum, based on its high activity in hydrosilylation reactions. The suitability of particular photoactivated hydrosilylation catalysts for use in the silicone composition of the present invention can be readily determined by routine experimentation.

Specific examples of suitable photoactivated hydrosilylation catalysts include, but are not limited to, platinum(II) β-diketonate complexes such as platinum(II) bis(2,4-pentanedioate), platinum(II) bis(2,4-hexanedioate), platinum(II) bis(2,4-heptanedioate), platinum(II) bis(1-phenyl-1,3-butanedioate), platinum(II) bis(1,3-diphenyl-1,3-propanedioate), platinum(II) bis(1,1,1,5,5,5-hexafluoro-2,4-pentanedioate); (η-cyclopentadienyl)trialkylplatinum complexes, such as (Cp)trimethylplatinum, (Cp)ethyldimethylplatinum, (Cp)triethylplatinum, (chloro-Cp)trimethylplatinum and (trimethylsilyl-Cp)trimethylplatinum, where Cp represents cyclopentadienyl; triazene oxide-transition metal complexes, such as $Pt[C_6H_5NNNOCH_3]_4$, $Pt[p-CN—C_6H_4NNNOC_6H_{11}]_4$, $Pt[p-H_3COC_6H_4NNNOC_6H_{11}]_4$, $Pt[p-CH_3(CH_2)_x—C_6H_4NNNOCH_3]_4$, 1,5-cyclooctadiene.$Pt[p-CN—C_6H_4NNNOC_6H_{11}]_2$, 1,5-cyclooctadiene.$Pt[p-CH_3O—C_6H_4NNNOCH_3]_2$, $[(C_6H_5)_3P]_3Rh[p-CN—C_6H_4NNNOC_6H_{11}]$ and $Pd[p-CH_3(CH_2)_x—C_6H_4NNNOCH_3]_2$, where x is 1, 3, 5, 11, or 17; (η-diolefin)(σ-aryl)platinum complexes, such as ($\eta^4$-1,5-cyclooctadienyl)diphenylplatinum, $\eta^4$-1,3,5,7-cyclooctatetraenyl)diphenylplatinum, ($\eta$4-2,5-norboradienyl)diphenylplatinum, ($\eta^4$-1,5-cyclooctadienyl)bis-(4-dimethylaminophenyl)platinum, ($\eta$4-1,5-cyclooctadienyl)bis-(4-acetylphenyl)platinum and ($\eta^4$-1,5-cyclooctadienyl)bis-(4-trifluormethylphenyl)platinum.

Typically, the photoactivated hydrosilylation catalyst is a Pt(II) β-diketonate complex and more typically the catalyst is platinum(II) bis(2,4-pentanedioate). The hydrosilylation catalyst (C) can be a single photoactivated hydrosilylation catalyst or a mixture comprising two or more different photoactivated hydrosilylation catalysts.

Methods of preparing photoactivated hydrosilylation catalysts are well known in the art. For example, methods of preparing platinum(II) β-diketonates are reported by Guo et al. (Chemistry of Materials, 1998, 10, 531-536). Methods of preparing (η-cyclopentadienyl)-trialkylplatinum complexes are disclosed in U.S. Pat. No. 4,510,094. Methods of preparing triazene oxide-transition metal complexes are disclosed in U.S. Pat. No. 5,496,961. Methods of preparing (η-diolefin)(σ-aryl)platinum complexes are taught in U.S. Pat. No. 4,530,879.

The concentration of the hydrosilylation catalyst (C) is sufficient to catalyze the addition reaction of the silicone resin (A) and the cross-linking agent (B). The concentration of the hydrosilylation catalyst (C) is sufficient to provide typically from 0.1 to 1000 ppm of platinum group metal, alternatively from 0.5 to 100 ppm of platinum group metal, alternatively from 1 to 25 ppm of platinum group metal, based on the combined weight of the silicone resin (A) and the cross-linking agent (B).

Optionally, the hydrosilylation-curable silicone composition further includes (D) a silicone rubber having a formula selected from the group of (i) $R^1R^2_2SiO(R^2_2SiO)_aSiR^2_2R^1$ and (ii) $R^5R^1_2SiO(R^1R^5SiO)_bSiR^1_2R^5$; wherein $R^1$ and $R^2$ are as defined and exemplified above, $R^5$ is $R^1$ or —H, subscripts a and b each have a value of from 1 to 4, alternatively from 2 to 4, alternatively from 2 to 3, and w, x, y, and z are also as defined and exemplified above, provided the silicone resin and the silicone rubber (D)(i) each have an average of at least two silicon-bonded alkenyl groups per molecule, the silicone rubber (D)(ii) has an average of at least two silicon-bonded hydrogen atoms per molecule, and the mole ratio of silicon-bonded alkenyl groups or silicon-bonded hydrogen atoms in the silicone rubber (D) to silicon-bonded alkenyl groups in the silicone resin (A) is from 0.01 to 0.5.

Specific examples of silicone rubbers suitable for use as component (D)(i) include, but are not limited to, silicone rubbers having the following formulae:

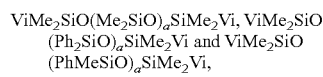

$ViMe_2SiO(Me_2SiO)_aSiMe_2Vi$, $ViMe_2SiO(Ph_2SiO)_aSiMe_2Vi$ and $ViMe_2SiO(PhMeSiO)_aSiMe_2Vi$, wherein Me is methyl, Ph is phenyl, Vi is vinyl, and the subscript a has a value of from 1 to 4. Silicone rubber (D)(i) can be a single silicone rubber or a mixture comprising two or more different silicone rubbers that each satisfy the formula for (D)(i).

Specific examples of silicone rubbers suitable for use as silicone rubber (D)(ii) include, but are not limited to, silicone rubbers having the following formulae:

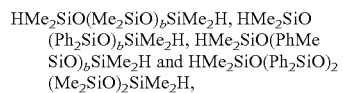

$HMe_2SiO(Me_2SiO)_bSiMe_2H$, $HMe_2SiO(Ph_2SiO)_bSiMe_2H$, $HMe_2SiO(PhMeSiO)_bSiMe_2H$ and $HMe_2SiO(Ph_2SiO)_2(Me_2SiO)_2SiMe_2H$, wherein Me is methyl, Ph is phenyl, and the subscript b has a value of from 1 to 4. Component (D)(ii) can be a single silicone rubber or a mixture comprising two or more different silicone rubbers that each satisfy the formula for (D)(ii).

The mole ratio of silicon-bonded alkenyl groups or silicon-bonded hydrogen atoms in the silicone rubber (D) to silicon-bonded alkenyl groups in the silicone resin (A) is typically from 0.01 to 0.5, alternatively from 0.05 to 0.4, alternatively from 0.1 to 0.3.

When the silicone rubber (D) is (D)(i), the concentration of the cross-linking agent (B) is such that the ratio of the number of moles of silicon-bonded hydrogen atoms in the cross-linking agent (B) to the sum of the number of moles of silicon-bonded alkenyl groups in the silicone resin (A) and the silicone rubber (D)(i) is typically from 0.4 to 2, alternatively from 0.8 to 1.5, alternatively from 0.9 to 1.1. Furthermore, when the silicone rubber (D) is (D)(ii), the concentration of the cross-linking agent (B) is such that the ratio of the sum of the number of moles of silicon-bonded hydrogen atoms in the cross-linking agent (B) and the silicone rubber (D)(ii) to the number of moles of silicon-bonded alkenyl groups in the silicone resin (A) is typically from 0.4 to 2, alternatively from 0.8 to 1.5, alternatively from 0.9 to 1.1.

Methods of preparing silicone rubbers containing silicon-bonded alkenyl groups or silicon-bonded hydrogen atoms are well known in the art; many of these compounds are commercially available.

In another embodiment, the hydrosilylation-curable silicone composition comprises (A$^1$) a rubber-modified silicone resin prepared by reacting the silicone resin (A) and at least one silicone rubber (D)(iii) selected from rubbers having the following formulae:

$$R^5R^1{}_2SiO(R^1R^5SiO)_cSiR^1{}_2R^5, \text{ and}$$

$$R^1R^2{}_2SiO(R^2{}_2SiO)_dSiR^2{}_2R^1,$$

wherein R$^1$ and R$^5$ are as defined and exemplified above and c and d each have a value of from 4 to 1000, alternatively from 10 to 500, alternatively from 10 to 50, in the presence of the hydrosilylation catalyst (c) and, optionally, an organic solvent, provided the silicone resin (A) has an average of at least two silicon-bonded alkenyl groups per molecule, the silicone rubber (D)(iii) has an average of at least two silicon-bonded hydrogen atoms per molecule, and the mole ratio of silicon-bonded hydrogen atoms in the silicone rubber (D)(iii) to silicon-bonded alkenyl groups in silicone resin (A) is from 0.01 to 0.5. By "at least one silicone rubber", it is meant that only one of the rubbers represented by the formulae are necessary for (D)(iii), and that combinations of the rubbers represented by the formulae may be used. When organic solvent is present, the rubber-modified silicone resin (A$^1$) is miscible in the organic solvent and does not form a precipitate or suspension.

The silicone resin (A), silicone rubber (D)(iii), hydrosilylation catalyst (c), and organic solvent can be combined in any order. Typically, the silicone resin (A), silicone rubber (D)(iii) and organic solvent are combined before the introduction of the hydrosilylation catalyst (c).

The reaction is typically carried out at a temperature of from room temperature (~23±2° C.) to 150° C., alternatively from room temperature to 100° C. The reaction time depends on several factors, including the structures of the silicone resin (A) and the silicone rubber (D)(iii) and the temperature. The components are typically allowed to react for a period of time sufficient to complete the hydrosilylation reaction. This means the components are typically allowed to react until at least 95 mol %, alternatively at least 98 mol %, alternatively at least 99 mol %, of the silicon-bonded hydrogen atoms originally present in the silicone rubber (D)(iii) have been consumed in the hydrosilylation reaction, as determined by FTIR spectrometry. The time of reaction is typically from 0.5 to 24 h at a temperature of from room temperature (~23±2° C.) to 100° C. The optimum reaction time can be determined by routine experimentation.

The mole ratio of silicon-bonded hydrogen atoms in the silicone rubber (D)(iii) to silicon-bonded alkenyl groups in the silicone resin (A) is typically from 0.01 to 0.5, alternatively from 0.05 to 0.4, alternatively from 0.1 to 0.3.

The concentration of the hydrosilylation catalyst (c) is sufficient to catalyze the addition reaction of the silicone resin (A) with the silicone rubber (D)(iii). Typically, the concentration of the hydrosilylation catalyst (c) is sufficient to provide from 0.1 to 1000 ppm of a platinum group metal, based on the combined weight of the resin and the rubber.

The concentration of the organic solvent is typically from 0 to 95% (w/w), alternatively from 10 to 75% (w/w), alternatively from 40 to 60% (w/w), based on the total weight of the reaction mixture.

The rubber-modified silicone resin (A$^1$) can be used without isolation or purification, or the rubber-modified silicone resin (A$^1$) can be separated from most of the solvent by conventional methods of evaporation. For example, the reaction mixture can be heated under reduced pressure. Moreover, when the hydrosilylation catalyst (c) is a supported catalyst, described above, the rubber-modified silicone resin (A$^1$) can be readily separated from the hydrosilylation catalyst (c) by filtering the reaction mixture. However, when the rubber-modified silicone resin (A$^1$) is not separated from the hydrosilylation catalyst (c) used to prepare the rubber-modified silicone resin (A$^1$), the hydrosilylation catalyst (c) may be used as the hydrosilylation catalyst (C).

The hydrosilylation-curable silicone composition of the present invention can comprise additional ingredients, as known in the art. Examples of additional ingredients include, but are not limited to, hydrosilylation catalyst inhibitors, such as 3-methyl-3-penten-1-yne, 3,5-dimethyl-3-hexen-1-yne, 3,5-dimethyl-1-hexyn-3-ol, 1-ethynyl-1-cyclohexanol, 2-phenyl-3-butyn-2-ol, vinylcyclosiloxanes and triphenylphosphine; adhesion promoters, such as the adhesion promoters taught in U.S. Pat. Nos. 4,087,585 and 5,194,649; dyes; pigments; anti-oxidants; heat stabilizers; UV stabilizers; flame retardants; flow control additives; and diluents, such as organic solvents and reactive diluents.

As an alternative to the hydrosilylation-curable silicone composition, condensation-curable silicone compositions are also suitable for use as the base material in embodiments.

The condensation-curable silicone composition typically includes a silicone resin (A$^2$) having silicon-bonded hydrogen atoms, silicon-bonded hydroxy groups, or silicon-bonded hydrolysable groups, optionally, a cross-linking agent (B$^1$) having silicon-bonded hydrolysable groups and, optionally, a condensation catalyst (C$^1$). The condensation curable silicone resin (A$^2$) is typically a copolymer comprising R$^1$SiO$_{3/2}$ units, i.e., T units and/or SiO$_{4/2}$ units, i.e., Q units, in combination with R$^1$R$^6{}_2$SiO$_{1/2}$ units, i.e., M units and/or R$^6{}_2$SiO$_{2/2}$ units, i.e., D units, wherein R$^1$ is set forth above, R$^6$ is R$^1$, —H, —OH, or a hydrolysable group. For example, the silicone resin can be a DT resin, an MT resin, an MDT resin, a DTQ resin, an MTQ resin, an MDTQ resin, a DQ resin, an MQ resin, a DTQ resin, an MTQ resin, or an MDQ resin.

According to one embodiment, the silicone resin (A$^2$) has the formula:

$$(R^1R^6{}_2SiO_{1/2})_{w'}(R^6{}_2SiO_{2/2})_{x'}(R^6SiO_{3/2})_{y'}(SiO_{4/2})_{z'} \quad \text{(V)}$$

wherein R$^1$ and R$^6$ are defined and exemplified above, w' is from 0 to 0.8, alternatively from 0.02 to 0.75, alternatively from 0.05 to 0.3, x' is from 0 to 0.95, alternatively from 0.05 to 0.8, alternatively from 0.1 to 0.3, y' is from 0 to 1, alternatively from 0.25 to 0.8, alternatively from 0.5 to 0.8 and z' is from 0 to 0.99, alternatively from 0.2 to 0.8, alternatively from 0.4 to 0.6. The silicone resin ($A^2$) has an average of at least two silicon-bonded hydrogen atoms, hydroxy groups, or hydrolysable groups per molecule. As used herein the term "hydrolysable group" means the silicon-bonded group reacts with water in the absence of a catalyst at any temperature from room temperature (~23±2° C.) to 100° C. within several minutes, for example thirty minutes, to form a silanol (Si—OH) group. Examples of hydrolysable groups represented by $R^6$ include, but are not limited to, —Cl, —Br, —OR$^7$, —OCH$_2$CH$_2$OR$^7$, CH$_3$C(=O)O—, Et(Me)C=N—O—, CH$_3$C(=O)N(CH$_3$)— and —ONH$_2$, wherein $R^7$ is $C_1$ to $C_8$ hydrocarbyl or $C_1$ to $C_8$ halogen-substituted hydrocarbyl.

The hydrocarbyl and halogen-substituted hydrocarbyl groups represented by $R^7$ typically have from 1 to 8 carbon atoms, alternatively from 3 to 6 carbon atoms. Acyclic hydrocarbyl and halogen-substituted hydrocarbyl groups containing at least 3 carbon atoms can have a branched or unbranched structure. Examples of hydrocarbyl groups represented by $R^7$ include, but are not limited to, unbranched and branched alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl and octyl; cycloalkyl, such as cyclopentyl, cyclohexyl and methylcyclohexyl; phenyl; alkaryl, such as tolyl and xylyl; aralkyl, such as benzyl and phenethyl; alkenyl, such as vinyl, allyl and propenyl; arylalkenyl, such as styryl; and alkynyl, such as ethynyl and propynyl. Examples of halogen-substituted hydrocarbyl groups represented by $R^7$ include, but are not limited to, 3,3,3-trifluoropropyl, 3-chloropropyl, chlorophenyl and dichlorophenyl.

Typically, at least 1 mol %, alternatively at least 5 mol %, alternatively at least 10 mol % of the groups $R^6$ in the silicone resin ($A^2$) are hydrogen, hydroxy, or a hydrolysable group. As used herein, the mol % of groups in $R^6$ is defined as a ratio of the number of moles of silicon-bonded groups in the silicone resin ($A^2$) to the total number of moles of the $R^6$ groups in the silicone resin ($A^2$), multiplied by 100.

Specific examples of cured silicone resins formed from silicone resin ($A^2$) include, but are not limited to, cured silicone resins having the following formulae:

$(MeSiO_{3/2})_{0.9}(Me(HO)SiO_{2/2})_{0.1}$, $(PhSiO_{3/2})_{0.7}(Ph(MeO)SiO_{2/2})_{0.3}$, $(Me_3SiO_{1/2})_{0.8}(SiO_{4/2})_{0.15}(HOSiO_{3/2})_{0.05}$, $(MeSi_{3/2})_{0.67}(PhSiO_{3/2})_{0.23}(Ph(HO)SiO_{2/2})_{0.1}$,

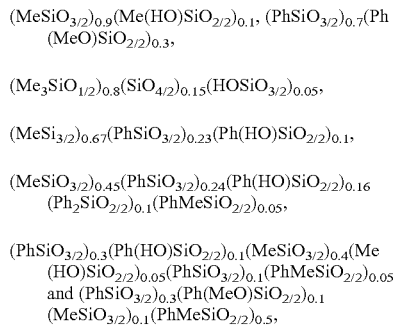

wherein Me is methyl, Ph is phenyl, the numerical subscripts outside the parenthesis denote mole fractions, and the subscript n has a value such that the silicone resin typically has a number-average molecular weight of from 500 to 50,000. The sequence of units in the preceding formulae is not to be viewed in any way as limiting to the scope of the invention.

As set forth above, the silicone resin ($A^2$) represented by formula (V) typically has a number-average molecular weight ($M_n$) of from 500 to 50,000. Alternatively, the silicone resin ($A^2$) may have a $M_n$ of at least 300, alternatively 1,000 to 3,000, where the molecular weight is determined by gel permeation chromatography employing a low angle laser light scattering detector, or a refractive index detector and silicone resin (MQ) standards.

The viscosity of the silicone resin ($A^2$) at 25° C. is typically from 0.01 Pa·s to solid, alternatively from 0.1 to 100,000 Pa·s, alternatively from 1 to 1,000 Pa·s.

In a second embodiment, the silicone resin ($A^2$) can have the same formula (V) as set forth above, but with different values for the subscripts x and z and with the proviso that the sum of $R^6SiO_{3/2}$ units and $SiO_{4/2}$ units is greater than zero and with the further proviso that the silicone resin ($A^2$) of the second embodiment contains at least two silicon-bonded hydrogen atoms, at least two silicon-bonded hydroxy groups, or at least two silicon-bonded hydrolysable groups per molecule. More specifically, for the silicone resin ($A^2$) of the second embodiment, w', y', $R^1$ and $R^6$ remain the same as set forth above, x'typically has a value of from 0 to 0.6, alternatively from 0 to 0.45, alternatively from 0 to 0.25, z' typically has a value of from 0 to 0.35, alternatively from 0 to 0.25, alternatively from 0 to 0.15, and the sum of y'+z' is greater than zero and is typically from 0.2 to 0.99, alternatively from 0.5 to 0.95, alternatively from 0.65 to 0.9. Further, the sum of w'+x'can be zero but is typically from 0.01 to 0.80, alternatively from 0.05 to 0.5, alternatively from 0.1 to 0.35. Typically, 1 mol % to 30 mol %, alternatively 1 to 15 mol %, of the $R^6$ groups in the silicone resin ($A^2$) of the second embodiment are hydrogen, hydroxy, or a hydrolysable group.

Examples of condensation curable silicone resins ($A^2$) of the second embodiment include, but are not limited to, silicone resins having the following formulae:

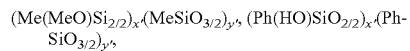

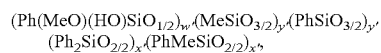

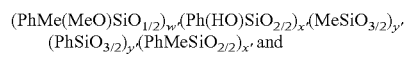

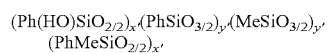

wherein Me is methyl, Ph is phenyl, wherein w', x', y' and z' are as defined above, and the subscript y' has a value such that the silicone resin has a number-average molecular weight of from 500 to 50,000. The sequence of units in the preceding formulae is not to be viewed in any way as limiting to the scope of the invention.

Specific examples of condensation curable silicone resins ($A^2$) of the second embodiment include, but are not limited to, silicone resins having the following formulae:

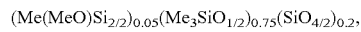

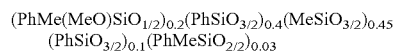

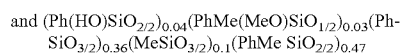

wherein Me is methyl, Ph is phenyl, and the numerical subscripts outside the parenthesis denote mole fractions. The sequence of units in the preceding formulae is not to be viewed in any way as limiting to the scope of the invention.

As set forth above, the condensation curable silicone resin ($A^2$) of the second embodiment typically has a number-average molecular weight ($M_n$) of from 500 to 50,000. Alternatively, the condensation curable silicone resin (A) may have a $M_n$ of from 500 to 10,000, alternatively 800 to 3,000, where the molecular weight is determined by gel permeation chromatography employing a refractive index detector and silicone resin (MQ) standards.

The viscosity of the condensation curable silicone resin ($A^2$) of the second embodiment at 25° C. is typically from 0.01 Pa·s to a solid, alternatively from 0.1 to 10,000 Pa·s, alternatively from 1 to 100 Pa·s. The condensation curable silicone resin (A) represented by formula (V) typically includes less than 20% (w/w), alternatively less than 10% (w/w), alternatively less than 2% (w/w), of silicon-bonded hydroxy groups, as determined by $^{29}$Si NMR.

Methods of preparing silicone resins ($A^2$) represented by formula (V) are well known in the art; many of these resins are commercially available. Silicone resins ($A^2$) represented by formula (V) are typically prepared by cohydrolyzing the appropriate mixture of chlorosilane precursors in an organic solvent, such as toluene. For example, a silicone resin including $R^1R^6_2SiO_{1/2}$ units and $R^6SiO_{3/2}$ units can be prepared by cohydrolyzing a first compound having the formula $R^1R^6_2SiCl$ and a second compound having the formula $R^6SiCl_3$ in toluene, where $R^1$ and $R^6$ are as defined and exemplified above. The cohydrolyzing process is described above in terms of the hydrosilylation-curable silicone composition. The cohydrolyzed reactants can be further "bodied" to a desired extent to control the amount of crosslinkable groups and viscosity.

If desired, the silicone resins ($A^2$) represented by formula (V) can be further treated with a condensation catalyst in an organic solvent to reduce the content of silicon-bonded hydroxy groups. Alternatively, first or second compounds containing hydrolysable groups other than chloro groups, such as —Br, —I, —OCH$_3$, —OC(O)CH$_3$, —N(CH$_3$)$_2$, NHCOCH$_3$ and —SCH$_3$, can be co-hydrolyzed to form the silicone resin ($A^2$). The properties of the silicone resin ($A^2$) depend on the types of first and second compounds, the mole ratio of first and second compounds, the degree of condensation, and the processing conditions.

The Q units in formula (V) can be in the form of discrete particles in the silicone resin ($A^2$). The particle size is typically from 1 nm to 20 μm. Examples of these particles include, but are not limited to, silica (SiO$_{4/2}$) particles of 15 nm in diameter.

In another embodiment, the condensation-curable silicone composition comprises a rubber-modified silicone resin ($A^3$) prepared by reacting an organosilicon compound selected from (i) a silicone resin having the formula $(R^1R^6_2SiO_{1/2})_{w'}(R^6_2SiO_{2/2})_{x'}(R^6SiO_{3/2})_{y'}(SiO_{4/2})_{z'}$, (ii) hydrolysable precursors of (i), and (iii) a silicone rubber having the formula $R^8_3SiO(R^1R^8SiO)_mSiR^8_3$ in the presence of water, (iv) a condensation catalyst and (v) an organic solvent, wherein $R^1$ and $R^6$ are as defined and exemplified above, $R^8$ is $R^1$ or a hydrolysable group, m is from 2 to 1,000, alternatively from 4 to 500, alternatively from 8 to 400, and w', x', y' and z' are as defined and exemplified above. Silicone resin (i) has an average of at least two silicon-bonded hydroxy or hydrolysable groups per molecule. The silicone rubber (iii) has an average of at least two silicon-bonded hydrolysable groups per molecule. The mole ratio of silicon-bonded hydrolysable groups in the silicone rubber (iii) to silicon-bonded hydroxy or hydrolysable groups in the silicone resin (i) is from 0.01 to 1.5, alternatively from 0.05 to 0.8, alternatively from 0.2 to 0.5.

In a first embodiment, typically at least 1 mol %, alternatively at least 5 mol %, alternatively at least 10 mol % of the groups $R^6$ in the silicone resin (i) are hydroxy or hydrolysable groups. In a second embodiment, typically 1 mol % to 30 mol %, or alternatively 1 to 15 mol % of the groups $R^6$ in the silicone resin (i) are hydrogen, hydroxy, or a hydrolysable group.

The silicone resin (i) of the first embodiment typically has a number-average molecular weight ($M_n$) of at least 300, alternatively from 500 to 50,000, alternatively from 800 to 3,000, where the molecular weight is determined by gel permeation chromatography employing a low angle laser light scattering detector, or a refractive index detector and silicone resin (MQ) standards.

Specific examples of silicone resins suitable for use as silicone resin (i) include, but are not limited to, resins having the following formulae:

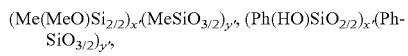

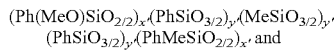

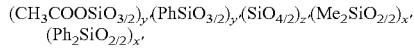

where Me is methyl, Ph is phenyl, where x', y', and z' are as defined above, and the subscript y' has a value such that the silicone resin has a number-average molecular weight of from 500 to 50,000. The sequence of units in the preceding formulae is not to be viewed in any way as limiting to the scope of the invention.

Other specific examples of silicone resins suitable for use as silicone resin (i) include, but are not limited to, resins having the following formulae:

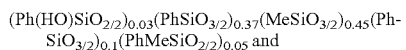

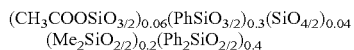

where Me is methyl, Ph is phenyl, the numerical subscripts outside the parenthesis denote mole fractions. The sequence of units in the preceding formulae is not to be viewed in any way as limiting to the scope of the invention. Silicone resin (i) can be a single silicone resin or a mixture comprising two or more different silicone resins, each having the specified formula. Silicone resin (i) can be a single silicone resin or a mixture comprising two or more different silicone resins, each having the specified formula.

As used herein, the term "hydrolysable precursors" refers to silanes having hydrolysable groups that are suitable for use as starting materials (precursors) for preparation of the silicone resin (i). The hydrolysable precursors (ii) can be represented by the formulae $R^1R^8_2SiX$, $R^8_2SiX_2$, $R^8SiX_3$ and $SiX_4$, wherein $R^1$, $R^8$ and X are as defined and exemplified above.

Specific examples of hydrolysable precursors (ii) include, but are not limited to, silanes having the formulae:

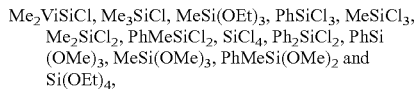

wherein Me is methyl, Et is ethyl and Ph is phenyl.

Specific examples of silicone rubbers (iii) include, but are not limited to, silicone rubbers having the following formulae:

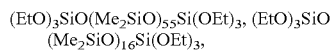(EtO)$_3$SiO(Me$_2$SiO)$_{55}$Si(OEt)$_3$, (EtO)$_3$SiO(Me$_2$SiO)$_{16}$Si(OEt)$_3$,

(EtO)$_3$SiO(Me$_2$SiO)$_{386}$Si(OEt)$_3$ and (EtO)$_2$MeSiO(PhMeSiO)$_{10}$SiMe(OEt)$_2$, wherein Me is methyl and Et is ethyl.

The reaction is typically carried out at a temperature of from room temperature (~23±2° C.) to 180° C., alternatively from room temperature to 100° C.

The reaction time depends on several factors, including the structures of the silicone resin (i) and the silicone rubber (iii), and the temperature. The components are typically allowed to react for a period of time sufficient to complete the condensation reaction. This means the components are allowed to react until at least 40 mol %, alternatively at least 65 mol %, alternatively at least 90 mol %, of the silicon-bonded hydrolysable groups originally present in the silicone rubber (iii) have been consumed in the condensation reaction, as determined by $^{29}$Si NMR spectrometry. The time of reaction is typically from 1 to 30 h at a temperature of from room temperature (~23±2° C.) to 100° C. The optimum reaction time can be determined by routine experimentation.

Suitable condensation catalysts (iv) are described in further detail below, and suitable organic solvents (v) are described above in the context of rubber-modified silicone resin (A$^1$) above. The concentration of the condensation catalyst (iv) is sufficient to catalyze the condensation reaction of the silicone resin (i) with the silicone rubber (iii). Typically, the concentration of the condensation catalyst (iv) is from 0.01 to 5% (w/w), alternatively from 0.01 to 3% (w/w), alternatively from 0.05 to 2.5% (w/w), based on the weight of the silicon resin (i). The concentration of the organic solvent (v) is typically from 10 to 95% (w/w), alternatively from 20 to 85% (w/w), alternatively from 50 to 80% (w/w), based on the total weight of the reaction mixture.

The concentration of water in the reaction mixture depends on the nature of the groups R$^8$ in the organosilicon compound and the nature of the silicon-bonded hydrolysable groups in the silicone rubber. When the silicone resin (i) contains hydrolysable groups, the concentration of water is sufficient to effect hydrolysis of the hydrolysable groups in the silicon resin (i) and the silicone rubber (iii). For example, the concentration of water is typically from 0.01 to 3 moles, alternatively from 0.05 to 1 moles, per mole of hydrolysable groups in the silicone resin (i) and the silicone rubber (iii) combined. When the silicone resin (i) does not contain hydrolysable groups, only a trace amount, e.g., 100 ppm, of water is typically present in the reaction mixture. Trace amounts of water are normally present in the reactants and/or solvent.

As set forth above, the condensation-curable silicone composition can further comprise the cross-linking agent (B$^1$). The cross-linking agent (B$^1$) can have the formula R$^7_q$SiX$_{4-q}$, wherein R$^7$ is C$_1$ to C$_8$ hydrocarbyl or C$_1$ to C$_8$ halogen-substituted hydrocarbyl, X is a hydrolysable group, and q is 0 or 1. The hydrocarbyl and halogen-substituted hydrocarbyl groups represented by R$^7$, and the hydrolysable groups represented by X, are as described and exemplified above.

Specific examples of cross-linking agents (B$^1$) include, but are not limited to, alkoxy silanes such as MeSi(OCH$_3$)$_3$, CH$_3$Si(OCH$_2$CH$_3$)$_3$, CH$_3$Si(OCH$_2$CH$_2$CH$_3$)$_3$, CH$_3$Si[O(CH$_2$)$_3$CH$_3$]$_3$, CH$_3$CH$_2$Si(OCH$_2$CH$_3$)$_3$, C$_6$H$_5$Si(OCH$_3$)$_3$, C$_6$H$_5$CH$_2$Si(OCH$_3$)$_3$, C$_6$H$_5$Si(OCH$_2$CH$_3$)$_3$, CH$_2$=CHSi(OCH$_3$)$_3$, CH$_2$=CHCH$_2$Si(OCH$_3$)$_3$, CF$_3$CH$_2$CH$_2$Si(OCH$_3$)$_3$, CH$_3$Si(OCH$_2$CH$_2$OCH$_3$)$_3$, CF$_3$CH$_2$CH$_2$Si(OCH$_2$CH$_2$OCH$_3$)$_3$, CH$_2$=CHSi(OCH$_2$CH$_2$OCH$_3$)$_3$, CH$_2$=CHCH$_2$Si(OCH$_2$CH$_2$OCH$_3$)$_3$, C$_6$H$_5$Si(OCH$_2$CH$_2$OCH$_3$)$_3$, Si(OCH$_3$)$_4$, Si(OC$_2$H$_5$)$_4$ and Si(OC$_3$H$_7$)$_4$; organoacetoxysilanes such as CH$_3$Si(OCOCH$_3$)$_3$, CH$_3$CH$_2$Si(OCOCH$_3$)$_3$ and CH$_2$=CHSi(OCOCH$_3$)$_3$; organoiminooxysilanes such as CH$_3$Si[O—N=C(CH$_3$)CH$_2$CH$_3$]$_3$, Si[O—N=C(CH$_3$)CH$_2$CH$_3$]$_4$ and CH$_2$=CHSi[O—N=C(CH$_3$)CH$_2$CH$_3$]$_3$; organoacetamidosilanes such as CH$_3$Si[NHC(=O)CH$_3$]$_3$ and C$_6$H$_5$Si[NHC(=O)CH$_3$]$_3$; amino silanes such as CH$_3$Si[NH(s-C$_4$H$_9$)]$_3$ and CH$_3$Si(NHC$_6$H$_{11}$)$_3$; and organoaminooxysilanes.

The cross-linking agent (B$^1$) can be a single silane or a mixture of two or more different silanes, each as described above. Also, methods of preparing tri- and tetra-functional silanes are well known in the art; many of these silanes are commercially available.

When present, the concentration of the cross-linking agent (B$^1$) in the condensation-curable silicone composition is sufficient to cure (cross-link) the condensation-curable silicone resin. The exact amount of the cross-linking agent (B$^1$) depends on the desired extent of cure, which generally increases as the ratio of the number of moles of silicon-bonded hydrolysable groups in the cross-linking agent (B$^1$) to the number of moles of silicon-bonded hydrogen atoms, hydroxy groups, or hydrolysable groups in the silicone resin (A$^2$) increases. Typically, the concentration of the cross-linking agent (B$^1$) is sufficient to provide from 0.2 to 4 moles of silicon-bonded hydrolysable groups per mole of silicon-bonded hydrogen atoms, hydroxy groups, or hydrolysable groups in the silicone resin (A$^2$). The optimum amount of the cross-linking agent (B$^1$) can be readily determined by routine experimentation.

Condensation catalyst (C$^1$) can be any condensation catalyst typically used to promote condensation of silicon-bonded hydroxy (silanol) groups to form Si—O—Si linkages. Examples of condensation catalysts include, but are not limited to, amines; and complexes of lead, tin, zinc and iron with carboxylic acids. In particular, the condensation catalyst (C$^1$) can be selected from tin(II) and tin(IV) compounds such as tin dilaurate, tin dioctoate and tetrabutyl tin; and titanium compounds such as titanium tetrabutoxide.

When present, the concentration of the condensation catalyst (C$^1$) is typically from 0.1 to 10% (w/w), alternatively from 0.5 to 5% (w/w), alternatively from 1 to 3% (w/w), based on the total weight of the silicone resin (A$^2$).

When the condensation-curable silicone composition includes the condensation catalyst (C$^1$), the condensation-curable silicone composition is typically a two-part composition where the silicone resin (A$^2$) and condensation catalyst (C$^1$) are in separate parts.

The condensation-curable silicone composition can further contain inorganic fillers in particulate form, such as silica, alumina, calcium carbonate and mica. In one embodiment, for example, the condensation-curable silicone composition further includes silica nanoparticles. The nanoparticles may help reduce the coefficient of thermal expansion of a reinforced substrate formed of the silicone composition. A low coefficient of thermal expansion may improve manufacturability of CIS-based photovoltaic devices. Nanoparticles may also increase mechanical strength of a substrate formed of the silicone composition. The silica nanoparticles can be any silica material having at least one physical dimension (e.g., particle diameter, layer thickness) less than about 200 nm. One particularly useful form of silica nanoparticles are fumed silica nanoparticles. Examples of useful commercially available unmodified silica starting materials include nano-sized colloidal silicas available under the product designations NALCO 1040, 1042, 1050, 1060, 2326, 2327 and 2329 colloidal silica from Nalco Chemical Co., Naperville, Ill., Aerosil® from Degussa, Ludox® from DuPont, Snowtex® from Nissan Chemical, Levasil® from Bayer, or Sylysia® from Fuji Silysia Chemical. Suitable fumed silicas include for example, products commercially available from DeGussa AG, (Hanau, Germany) under the trade designation, "Aerosil series OX 50", as well as product numbers-130, -150 and -200. Fumed silicas are also commercially available from Cabot Corp., Tuscola, I, under the Bade designations CAB O-SPERSE 2095", "CAB-O-SPERSE A105" and "CAB-O-SIL M5". Those skilled in the art are aware of different well-established processes to access particles in different sizes, with different physical properties and with different compositions such as flame-hydrolysis (Aerosil-Process), plasma-process, arc-process and hot-wall reactor-process for gas-phase or solid-phase reactions or ionic-exchange processes and precipitation processes for solution-based reactions.

The silica nanoparticles may be in the form of a colloidal dispersion. The silica nanoparticles thus may be dispersed in a polar solvent such as methanol, ethanol, isopropyl alcohol (IPA), ketones such as methyl isobutyl ketone, water, acetic acid, diols and trials such as propylene glycol, 2-methyl-1,3-propane diol $HOCH_2CH(CH_3)CH_2OH$, 1,2-hexanediol $CH_3(CH_2)_3CH(OH)CH_2OH$ and glycerol; glycerol esters such as glyceryl triacetate (triacetin), glyceryl tripropionate (tripropionin) and glyceryl tributyrate (tributyrin); and polyglycols such as polyethylene glycols and polypropylene glycols, among which are PPG-14 butyl ether $C_4Hg(OCH(CH_3)CH_2)_{14}OH$. Alternatively, the silica nanoparticles can also be dispersed in a non-polar solvent such as toluene, benzene, xylene, etc.

The silica particle size typically ranges from 1 to 1000 nm, or alternatively from 1 to 100 nm, or alternatively from 5 to 30 nm. The silica nanoparticles can be a single type of silica nanoparticles or a mixture comprising at least two different types of silica nanoparticles. It is known that silica nanoparticles may be of pure silicon dioxide, or they may contain a certain amount of impurities such as $Al_2O_3$, ZnO and/or cations such as $Na^+$, $K^{++}$, $Ca^{++}$, $Mg^{++}$, etc.

The concentration of the silica nanoparticles is typically from 0.0001 to 99 wt %, alternatively from 0.001 to 75 wt %, alternatively from 10 to 65 wt %, alternatively from 5 to 50 wt %, alternatively from 20 to 40 wt %, based on the total weight of the condensation-curable silicone composition. The condensation-curable silicone composition can be a one-part composition comprising the condensation-curable silicone resin ($A^2$ or $A^3$) and any optional ingredients, and silica nanoparticles in a single part or, alternatively, a multi-part composition comprising these components in two or more parts.

The one-part condensation-curable silicone composition can be prepared by combining the condensation curable silicone resin ($A^2$ or $A^3$), the silica nanoparticles and any optional ingredients in the stated proportions at ambient temperature, with or without the aid of an organic solvent. Also, the silicone composition can be prepared by combining the components in each part. The condensation-curable silicone compositions including the silica nanoparticles can also be prepared in-situ, i.e., the silica nanoparticles can be added during the process to manufacture the condensation-curable silicone resin ($A^2$ or $A^3$) described above. Mixing can be accomplished by any of the techniques known in the art such as milling, blending and stirring, either in a batch or continuous process.

The condensation-curable silicone composition can comprise additional ingredients, as known in the art and as described above for the hydrosilylation-curable silicone composition.

In yet another embodiment, the silicone composition may be a free radical-curable silicone composition. Examples of free radical-curable silicone compositions include peroxide-curable silicone compositions, radiation-curable silicone compositions containing a free radical photoinitiator, and high energy radiation-curable silicone compositions. Typically, the free radical-curable silicone composition comprises a silicone resin ($A^4$) and, optionally, a cross-linking agent ($B^2$) and/or a free radical initiator ($C^2$ (e.g., a free radical photoinitiator or organic peroxide).

The silicone resin ($A^4$) can be any silicone resin that can be cured (i.e., cross-linked) by at least one method selected from (i) exposing the silicone resin to radiation having a wavelength of from 150 to 800 nm in the presence of a free radical photoinitiator, (ii) heating the silicone resin ($A^4$) in the presence of an organic peroxide and (iii) exposing the silicone resin ($A^4$) to an electron beam. The silicone resin ($A^4$) is typically a copolymer containing T siloxane units and/or Q siloxane units in combination with M and/or D siloxane units.

For example, the silicone resin ($A^4$) may have the formula $(R^1R^9{}_2SiO_{1/2})_{w''}(R^9{}_2SiO_{2/2})_{x''}(R^9SiO_{3/2})_{y''}(SiO_{4/2})_{z''}$, wherein $R^1$ is as defined and exemplified above, $R^9$ is $R^1$, alkenyl, or alkynyl, w" is from 0 to 0.99, x" is from 0 to 0.99, y" is from 0 to 0.99, z" is from 0 to 0.85, and w"+x"+y"+z"=1.

The alkenyl groups represented by $R^9$, which may be the same or different, are as defined and exemplified in the description of $R^2$ above.

The alkynyl groups represented by $R^9$, which may be the same or different, typically have from 2 to about 10 carbon atoms, alternatively from 2 to 6 carbon atoms, and are exemplified by, but are not limited to, ethynyl, propynyl, butynyl, hexynyl and octynyl.

The silicone resin ($A^4$) typically has a number-average molecular weight ($M_n$) of at least 300, alternatively from 500 to 10,000, alternatively from 1,000 to 3,000, where the molecular weight is determined by gel permeation chromatography employing a refractive index detector and silicone resin (MQ) standards.

The silicone resin ($A^4$) can contain less than 10% (w/w), alternatively less than 5% (w/w), alternatively less than 2% (w/w), of silicon-bonded hydroxy groups, as determined by $^{29}Si$ NMR.

Specific examples of silicone resins ($A^4$) that are suitable for purposes of the present invention include, but are not limited to, silicone resins having the following formulae:

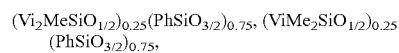

$(Vi_2MeSiO_{1/2})_{0.25}(PhSiO_{3/2})_{0.75}$, $(ViMe_2SiO_{1/2})_{0.25}(PhSiO_{3/2})_{0.75}$,

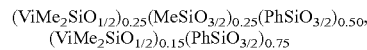

$(ViMe_2SiO_{1/2})_{0.25}(MeSiO_{3/2})_{0.25}(PhSiO_{3/2})_{0.50}$, $(ViMe_2SiO_{1/2})_{0.15}(PhSiO_{3/2})_{0.75}$

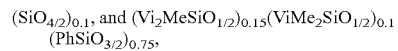

$(SiO_{4/2})_{0.1}$, and $(Vi_2MeSiO_{1/2})_{0.15}(ViMe_2SiO_{1/2})_{0.1}(PhSiO_{3/2})_{0.75}$, wherein Me is methyl, Vi is vinyl, Ph is phenyl and the numerical subscripts outside the parenthesis denote mole fractions. The sequence of units in the preceding formulae is not to be viewed in any way as limiting to the scope of this disclosure.

The free radical-curable silicone composition of the present method can comprise additional ingredients including, but not limited to, silicone rubbers; unsaturated compounds; free radical initiators; organic solvents; UV stabilizers; sensitizers; dyes; flame retardants; antioxidants; fillers, such as reinforcing fillers, extending fillers and conductive fillers; and adhesion promoters.

The free radical-curable silicone composition can further comprise an unsaturated compound selected from (i) at least one organosilicon compound having at least one silicon-bonded alkenyl group per molecule, (ii) at least one organic compound having at least one aliphatic carbon-carbon double bond per molecule, and (iii) mixtures comprising (i) and (ii), wherein the unsaturated compound has a molecular weight less than 500. Alternatively, the unsaturated compound has a molecular weight of less than 400 or less than 300. Also, the unsaturated compound can have a linear, branched, or cyclic structure.

The organosilicon compound (I) can be an organosilane or an organosiloxane. The organosilane can be a monosilane, disilane, trisilane, or polysilane. Similarly, the organosiloxane can be a disiloxane, trisiloxane, or polysiloxane. Cyclosilanes and cyclosiloxanes typically have from 3 to 12 silicon atoms, alternatively from 3 to 10 silicon atoms, alternatively from 3 to 4 silicon atoms. In acyclic polysilanes and polysiloxanes, the silicon-bonded alkenyl group(s) can be located at terminal, pendant, or at both terminal and pendant positions.

Specific examples of organosilanes include, but are not limited to, silanes having the following formulae:

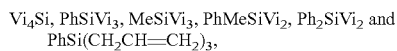

wherein Me is methyl, Ph is phenyl and Vi is vinyl.

Specific examples of organosiloxanes include, but are not limited to, siloxanes having the following formulae:

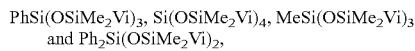

wherein Me is methyl, Vi is vinyl and Ph is phenyl.

The organic compound can be any organic compound containing at least one aliphatic carbon-carbon double bond per molecule, provided the compound does not prevent the silicone resin ($A^4$) from curing to form a silicone resin film. The organic compound can be an alkene, a diene, a triene, or a polyene. Further, in acyclic organic compounds, the carbon-carbon double bond(s) can be located at terminal, pendant, or at both terminal and pendant positions.

The organic compound can contain one or more functional groups other than the aliphatic carbon-carbon double bond. Examples of suitable functional groups include, but are not limited to, —O—, >C═O, —CHO, —CO$_2$—, —C≡N, —NO$_2$, >C═C<, —C≡C—, —F, —Cl, —Br and —I. The suitability of a particular unsaturated organic compound for use in the free-radical curable silicone composition of the present invention can be readily determined by routine experimentation.

The organic compound can be in a liquid or solid state at room temperature. Also, the organic compound can be soluble, partially soluble, or insoluble in the free-radical curable silicone composition. The normal boiling point of the organic compound, which depends on the molecular weight, structure and number and nature of functional groups in the compound, can vary over a wide range. Typically, the organic compound has a normal boiling point greater than the cure temperature of the composition. Otherwise, appreciable amounts of the organic compound may be removed by volatilization during cure.

Examples of organic compounds containing aliphatic carbon-carbon double bonds include, but are not limited to, 1,4-divinylbenzene, 1,3-hexadienylbenzene and 1,2-diethenylcyclobutane.

The unsaturated compound can be a single unsaturated compound or a mixture comprising two or more different unsaturated compounds, each as described above. For example, the unsaturated compound can be a single organosilane, a mixture of two different organosilanes, a single organosiloxane, a mixture of two different organosiloxanes, a mixture of an organosilane and an organosiloxane, a single organic compound, a mixture of two different organic compounds, a mixture of an organosilane and an organic compound, or a mixture of an organosiloxane and an organic compound.

The concentration of the unsaturated compound is typically from 0 to 70% (w/w), alternatively from 10 to 50% (w/w), alternatively from 20 to 40% (w/w), based on the total weight of the free radical-curable silicone composition.

Methods of preparing organosilanes and organosiloxanes containing silicon-bonded alkenyl groups, and organic compounds containing aliphatic carbon-carbon double bonds are well known in the art; many of these compounds are commercially available.

The free radical initiator is typically a free radical photoinitiator or an organic peroxide. Further, the free radical photoinitiator can be any free radical photoinitiator capable of initiating cure (cross-linking) of the silicone resin upon exposure to radiation having a wavelength of from 200 to 800 nm.

Examples of free radical photoinitiators include, but are not limited to, benzophenone; 4,4'-bis(dimethylamino)benzophenone; halogenated benzophenones; acetophenone; α-hydroxyacetophenone; chloro acetophenones, such as dichloroacetophenones and trichloroacetophenones; dialkoxyacetophenones, such as 2,2-diethoxyacetophenone; α-hydroxyalkylphenones, such as 2-hydroxy-2-methyl-1-phenyl-1-propanone and 1-hydroxycyclohexyl phenyl ketone; α-aminoalkylphenones, such as 2-methyl-4'-(methylthio)-2-morpholiniopropiophenone; benzoin; benzoin ethers, such as benzoin methyl ether, benzoin ethyl ether and benzoin isobutyl ether; benzil ketals, such as 2,2-dimethoxy-2-phenylacetophenone; acylphosphinoxides, such as diphenyl(2,4,6-trimethylbenzoyl)phosphine oxide; xanthone derivatives; thioxanthone derivatives; fluorenone derivatives; methyl phenyl glyoxylate; acetonaphthone; anthraquinone derivatives; sulfonyl chlorides of aromatic compounds; and O-acyl α-oximinoketones, such as 1-phenyl-1,2-propanedione-2-(O-ethoxycarbonyl)oxime.

The free radical photoinitiator can also be a polysilane, such as the phenylmethylpolysilanes defined by West in U.S. Pat. No. 4,260,780, the disclosure of which as it relates to the phenylmethylpolysilanes is hereby incorporated by reference; the aminated methylpolysilanes defined by Baney et al. in U.S. Pat. No. 4,314,956, the disclosure of which is hereby incorporated by reference as it relates to aminated methylpolysilanes; the methylpolysilanes defined by Peterson et al. in U.S. Pat. No. 4,276,424, the disclosure of which is hereby incorporated by reference as it relates to methylpolysilanes; and the polysilastyrene defined by West et al. in U.S. Pat. No. 4,324,901, the disclosure of which is hereby incorporated by reference as it relates to polysilastyrene.

The free radical photoinitiator can be a single free radical photoinitiator or a mixture comprising two or more different free radical photoinitiators. The concentration of the free radical photoinitiator is typically from 0.1 to 6% (w/w), alternatively from 1 to 3% (w/w), based on the weight of the silicone resin ($A^4$).

The free radical initiator can also be an organic peroxide. Examples of organic peroxides include, diaroyl peroxides such as dibenzoyl peroxide, di-p-chlorobenzoyl peroxide and bis-2,4-dichlorobenzoyl peroxide; dialkyl peroxides such as di-t-butyl peroxide and 2,5-dimethyl-2,5-di-(t-butylperoxy)hexane; diaralkyl peroxides such as dicumyl peroxide; alkyl aralkyl peroxides such as t-butyl cumyl peroxide and 1,4-bis (t-butylperoxyisopropyl)benzene; and alkyl aroyl peroxides such as t-butyl perbenzoate, t-butyl peracetate and t-butyl peroctoate.

The organic peroxide can be a single peroxide or a mixture comprising two or more different organic peroxides. The concentration of the organic peroxide is typically from 0.1 to 5% (w/w), alternatively from 0.2 to 2% (w/w), based on the weight of the silicone resin ($A^4$).

The free radical-curable silicone composition can further comprise at least one organic solvent. The organic solvent can be any aprotic or dipolar aprotic organic solvent that does not react with the silicone resin ($A^4$) or additional ingredient(s) and is miscible with the silicone resin ($A^4$). Examples of organic solvents include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, toluene, xylene and mesitylene; cyclic ethers such as tetrahydrofuran (THF) and dioxane; ketones such as methyl isobutyl ketone (MIBK); halogenated alkanes such as trichloroethane; and halogenated aromatic hydrocarbons such as bromobenzene and chlorobenzene. The organic solvent can be a single organic solvent or a mixture comprising two or more different organic solvents, as described above.

The concentration of the organic solvent is typically from 0 to 99% (w/w), alternatively from 30 to 80% (w/w), alternatively from 45 to 60% (w/w), based on the total weight of the free radical-curable silicone composition.

When the free-radical curable silicone composition described above contains one or more additional ingredients, for example, a free radical initiator, the composition can be a one-part composition comprising the silicone resin and optional ingredient(s) in a single part, or a multi-part composition comprising the components in two or more parts.

Another suitable silicone composition comprises cyclic dihydrogenpolysiloxanes, which have a weight-average molecular weight ranging in value from 1,500 to 1,000,000, are liquid at room temperature (~23±2° C.), and comprise $H_2SiO_{2/2}$ units. The cyclic dihydrogenpolysiloxanes can be produced by subjecting dichlorosilane ($H_2SiCl_2$) to hydrolysis/condensation in a mixture of a non-polar organic solvent and water and removing volatile cyclic dihydrogenpolysiloxanes from the formed cyclic dihydrogenpolysiloxanes.

The non-polar organic solvents used herein are exemplified by aromatic hydrocarbon organic solvents and aliphatic hydrocarbon organic solvents, with the aromatic hydrocarbon organic solvents exemplified by toluene and xylene and the aliphatic hydrocarbon organic solvents exemplified by hexane, heptane, octane and cyclohexane.

The hydrolysis/condensation reaction is typically conducted via slow dropwise addition of a non-polar organic solvent solution of dichlorosilane while stinting the non-polar organic solvent and water. It is preferred to conduct the dropwise addition at a temperature of not more than 5° C. in order to prevent volatilization of the dihydrogenpolysiloxane.

The hydrolysis/condensation is typically conducted in a mixture of a non-polar organic solvent phase and an aqueous phase, followed by washing the non-polar organic solvent phase containing the formed cyclic dihydrogenpolysiloxane with water, drying it, and eluting the non-polar organic solvent and volatile cyclic dihydrogenpolysiloxanes.

Once the dropwise addition is complete, allowing the solution to stand causes it to separate into a non-polar organic solvent layer and an aqueous layer, after which the non-polar organic solvent layer is removed and washed with water. Typically, the non-polar organic solvent layer is washed until it becomes neutral or until chlorine ions are no longer detected. The non-polar organic solvent layer may also be washed to a certain extent and neutralized with a weak alkali, e.g. calcium carbonate, sodium carbonate, or sodium bicarbonate, followed by washing the formed salts with water. The washed non-polar organic solvent layer may be dried and the non-polar organic solvent and volatile cyclic dihydrogenpolysiloxanes are typically eluted. Although there are no particular limitations concerning the method used to dry the washed non-polar organic solvent layer so long as it does not alter the cyclic dihydrogenpolysiloxanes, a powdered or granulated drying agent, e.g. anhydrous magnesium sulfate, anhydrous sodium sulfate, or a molecular sieve, may be added. The resulting mixture is subjected to agitation, and the drying agent filtered off. There are also no particular limitations concerning elution of the non-polar organic solvent and cyclic dihydrogenpolysiloxane so long as the cyclic dihydrogenpolysiloxanes are not altered. Elution may be exemplified by heating under reduced pressure or blowing in dry nitrogen gas under heating. The volatile cyclic dihydrogenpolysiloxanes mentioned herein are 3-mers ~5-mers. The fact that the product is a cyclic dihydrogenpolysiloxane is ascertained by the absence of silanol group absorption when analyzed using FT-IR.

The cyclic dihydrogenpolysiloxanes can also be produced by subjecting dichlorosilane to co-hydrolysis/condensation in a mixture of the non-polar organic solvent, hydrochloric acid and an ionic surface active agent, and removing volatile cyclic dihydrogenpolysiloxanes from the formed dihydrogenpolysiloxanes as described above. The hydrochloric acid is typically concentrated hydrochloric acid and, more typically, hydrochloric acid with a hydrogen chloride content of 15 wt % to 37 wt %. The ionic surface active agents may include anionic surface active agents, cationic surface active agents and amphoteric surface active agents, with the anionic surface active agents exemplified by alkali metal salts of aliphatic hydrocarbon sulfonic acids, e.g. alkali metal salts of alkylsulfonic acids of 6 to 20 carbon atoms, alkali metal salts of alkenesulfonic acids of 6 to 20 carbon atoms and alkali metal salts of alkylbenzenesulfonic acids; aliphatic hydrocarbon sulfonic acids, e.g. alkylsulfonic acids of 6 to 20 carbon atoms, alkenesulfonic acids of 6 to 20 carbon atoms; alkylbenzenesulfonic acids; alkali metal salts of alkylsulfonic esters; and alkali metal salts of higher aliphatic acids. Sodium and potassium are preferred as the alkali metals used herein. The cationic surface active agents are exemplified by quaternary ammonium salts, e.g. tetramethylammonium chloride, benzyltributylammonium chloride, cetyltrimethylammonium chloride and tetrabutylammonium chloride; and by alkylamine hydrochlorides, e.g. decylamine hydrochloride. The ionic surface active agents are typically used in an amount of from 0.01~50 wt %, more typically from 0.1~1.0 wt %, of the water contained in the hydrochloric acid.

Typically, the hydrolysis/condensation reaction is carried out via dropwise addition of the non-polar organic solvent solution containing dichlorosilane to a mixture including the non-polar organic solvent, hydrochloric acid and the ionic surface active agent. Typically, agitation is continued during the dropwise addition. The hydrolysis/condensation reaction typically occurs at a temperature of not more than 5° C. in order to prevent volatilization of the dichlorosilane.

Another suitable silicone composition comprises hydrogenpolysiloxanes having a siloxane unit formula of $[H_2SiO_{2/2}]_{x'''}[HSiO_{3/2}]_{y'''}[SiO_{4/2}]_{z'''}$ where $x'''$, $y'''$ and $z'''$ represent mole fractions, $0.12 \leq x''' < 1.0$, $0 \leq y''' \leq 0.88$, $0 \leq z''' \leq 0.30$, $y'''$ and $z'''$ are not simultaneously 0, and $x'''+y'''+z'''=1$. The hydrogenpolysiloxanes typically have a weight-average molecular weight ranging in value from 500 to 1,000,000 and are liquid at temperatures of 120° C. or less.

When $z'''=0$ in the siloxane unit formula $[H_2SiO_{2/2}]_{x'''}[HSiO_{3/2}]_{y'''}[SiO_{4/2}]_{z'''}$, the hydrogenpolysiloxanes is described by the siloxane unit formula $[H_2SiO_{2/2}]_{x'''}[HSiO_{3/2}]_{y'''}$ wherein $x'''$ and $y'''$ represent mole fractions as set forth above and $x'''+y'''=1$. When $z'''=0$, typically $0.15 \leq x''' \leq 1.0$ and $0 < y''' \leq 0.85$ because when $x'''$ is smaller than 0.15, the degree of branching increases and cracking becomes more likely to happen upon cure.

When $y'''=O$ in the siloxane unit formula $[H_2SiO_{2/2}]_{x'''}[HSiO_{3/2}]_{y'''}[SiO_{4/2}]_{z'''}$, the hydrogenpolysiloxanes is described by the siloxane unit formula $[H_2SiO_{2/2}]_{x'''}[SiO_{4/2}]_{z'''}$ wherein $x'''$ and $z'''$ represent mole fractions as set forth above and $x'''+z'''=1$. When $y'''=0$, typically $0.15 \leq x''' < 1.0$ because when $x'''$ is smaller than 0.15, the degree of branching increases and cracking becomes more likely to happen upon cure, and $0 < z''' \leq 0.15$ because when $z'''$ is larger than 0.15, the degree of branching increases and cracking becomes more likely to happen upon cure.

On the average, the hydrogenpolysiloxanes have the above-mentioned siloxane unit formulas in mole fractions of $x'''$, $y'''$ and $z'''$, which does not imply an arrangement in the order of the above-mentioned siloxane units. When siloxane units are arranged randomly in the hydrogenpolysiloxanes, there may be cases in which some block portions are present, but the rest of the units are arranged in a random fashion. Since $[H_2SiO_{2/2}]$ units are always present, there may be linear blocks, but because there are always $[HSiO_{3/2}]$ units and/or $[SiO_{4/2}]$ units, the molecular structure is at least branched and may be network- or cage-like as well, i.e. it could be a resin. When the hydrogenpolysiloxanes have $[SiO_{4/2}]$ units, the degree of branching increases even more.

The hydrogenpolysiloxanes can be produced by a process wherein (A') dichlorosilane ($H_2SiCl_2$), (B') trichlorosilane ($HSiCl_3$) and (C') tetraalkoxysilane ($Si(OR)_4$) or tetrachlorosilane ($SiCl_4$) are subjected to co-hydrolysis/condensation in mole ratios such that $0.12 \leq (A') \leq 1.0$, $0 \leq (B') \leq 0.88$, $0 \leq (C') \leq 0.30$, (A') and (B') are not simultaneously 0, and $(A')+(B')+(C')=1$ in a mixture of a non-polar organic solvent, hydrochloric acid, and an ionic surface active agent, whereupon the formed hydrogenpolysiloxane-containing non-polar organic solvent layer is washed with water, dried, and the non-polar organic solvent is eluted together with volatile hydrogenpolysiloxanes. In this instance, R stands for an alkyl group, typically ethyl, and can be a methyl or propyl group as well. The specific method steps are performed in the same manner as set forth above for the cyclic dihydrogenpolysiloxanes.

In addition, hydrogenpolysiloxanes of the siloxane unit formula $[H_2SiO_{2/2}]_{x'''}[HSiO_{3/2}]_{y'''}$ can be produced via co-hydrolysis of (A') dichlorosilane ($H_2SiCl_2$) and (B') trichlorosilane ($HSiCl_3$), and hydrogenpolysiloxanes of the siloxane unit formula $[H_2SiO_{2/2}]_{x'''}[SiO_{4/2}]_{z'''}$ (wherein $x'''$ and $z'''$ represent mole fractions, $0.12 \leq x''' < 1.0$, $0 < z''' \leq 0.30$ and $x'''+z'''=1$) can be produced via co-hydrolysis of (A') dichlorosilane ($H_2SiCl_2$) and (C') tetraalkoxysilane ($Si(OR)_4$) or tetrachlorosilane ($SiCl_4$).

The hydrochloric acid is typically concentrated hydrochloric acid, and, even more typically, hydrochloric acid with a hydrogen chloride content of 15 wt % to 37 wt %. Because water contained in the hydrochloric acid is used for the hydrolysis of (A') dichlorosilane ($H_2SiCl_2$), (B') trichlorosilane ($HSiCl_3$) and (C') tetraalkoxysilane ($Si(OR)_4$) or tetrachlorosilane ($SiCl_4$), the hydrochloric acid is typically used in an amount that is equal to or higher than the equimolar amount necessary for the hydrolysis of (A') dichlorosilane ($H_2SiCl_2$), (B') trichlorosilane ($HSiCl_3$) and (C') tetraalkoxysilane ($Si(OR)_4$) or tetrachlorosilane ($SiCl_4$).

The ionic surface active agents are described above and suppress gelling due to independent condensation and rapid hydrolysis/condensation of trichlorosilane and promote its co-hydrolysis/condensation with dichlorosilane.

When the cyclic dihydrogenpolysiloxanes, as well as the hydrogenpolysiloxanes that have the siloxane unit formula of $[H_2SiO_{2/2}]_{x'''}[HSiO_{3/2}]_{y'''}[SiO_{4/2}]_{z'''}$, are heated to a temperature of 120° C. or higher, silicon-bonded hydrogen is turned into hydroxyl groups via an oxidation reaction and crosslinking takes place as a result of a dehydration condensation reaction with the silicon-bonded hydrogen atoms. In other words, crosslinking and curing take place as a result of forming Si—O—Si bonds. In wet ammonia, hydrogen atoms directly bonded to silicon become activated and turn into hydroxyl groups by readily reacting with moisture in the air, thereby causing a dehydration condensation reaction with silicon-bonded hydrogen atoms and cross-linking. As a result, silica (silicon oxide) is formed. However, there is no need to eliminate all hydrogen atoms directly bonded to silicon atoms in the molecules of the above-mentioned cyclic dihydrogenpolysiloxanes and the above-mentioned hydrogenpolysiloxanes and some of the hydrogen atoms, for instance, 60 mol % or less, may be left intact.

The heating may occur in an oxygen atmosphere. Air is a representative example of the oxygen atmosphere. The oxygen atmosphere may alternatively be an oxygen gas-containing nitrogen gas or helium gas with an oxygen concentration lower than that of air. Alternatively, exposure to ozone, nitrous oxide, or wet ammonia may be used to induce reaction of the cyclic dihydrogenpolysiloxanes and hydrogenpolysiloxanes. The ozone is exemplified by pure ozone, ozone-containing air, steam-containing ozone and ozone-containing nitrogen gas, any of which can be used. The reaction, when induced by ozone, occurs in a more efficient manner than when the reaction is induced by atmospheric oxygen. The nitrous oxide is exemplified by pure nitrous oxide gas, nitrous oxide-containing air and nitrous oxide-containing nitrogen gas, any of which can be used. The wet ammonia is exemplified by ammonia-containing air, ammonium hydroxide gas and nitrogen gas containing ammonia and steam, any of which can be used. The exposure to ozone, exposure to nitrous oxide, or exposure to ammonia may be carried out under heating.

The above-mentioned cyclic dihydrogenpolysiloxanes and hydrogenpolysiloxanes may also be cured by high-energy irradiation. Electron beams and X-rays are representative examples of such irradiation. The amount of electron beam irradiation is typically not less than 3 Gry.

The following examples are meant to illustrate reinforced substrates and are not to be viewed in any way as limiting the scope of the present disclosure.

Example 1

Preparation of Fiber Reinforced Substrates from MP101 Crystal Coat Resin

A four-inch wide saturation trough was used. Style 106 glass fabric, obtained from BGF Industries and heat cleaned in air, was cut into strips 15"×3.5" in size. Approximately 7 ml of the MP101 resin, available from SDC Technologies, Inc., was placed in the saturation trough and the glass fabric was drawn through the resin solution to form an impregnated fiber reinforcement. The impregnated fiber reinforcement was hung vertically in a fumed hood to dry and then transferred to an air-circulating oven to cure. The impregnated fiber reinforcement was partially cured at 50° C. for 10 min. and then impregnated again with the same resin. After drying, the impregnated fiber reinforcement was cured by the following procedure: 1° C./min. to 75° C., 75° C./1 h., 1° C./min. to 100° C., 100° C./1 h., 1° C./min. to 125° C. and 125° C./1 h to form the fiber reinforced substrate. The fiber reinforced substrate was kept in the switched off oven to cool.

Example 2

Preparation and Properties of Fiber Reinforced Substrates from the MP101 Crystal Coat Resin and 0.2 wt % Treated Pyrograf III 0.031 grams of oxidized Pyrograf III was mixed into 50 grams of MP101 Crystal Coat resin in a glass vial and placed in a Bransonic ultrasonic cleaning bath and dispersed for 30 minutes. The mixture was then centrifuged if there was undispersed powder and the top dispersion was taken for film preparation.

The Style 106 glass fabric was heated, cleaned and cut into a shape that would fit into the saturation pan. The mixture of the Pyrograf III and MP101 Crystal Coat resin was placed in the saturation pan, and the fabric was passed through the mixture in the saturation pan to form an impregnated fiber reinforcement. The impregnated fiber reinforcement was hung vertically in a fumed hood to dry and then transferred to an air-circulating oven to cure by the following procedure: 1° C./min. to 75° C., 75° C./1 h., 1° C./min. to 100° C., 100° C./1 h., 1° C./min. to 125° C. and 125° C./1 h to form the fiber reinforced substrate. The fiber reinforced substrate was kept in the switched off oven to cool.

Example 3

Preparation and Properties of Fiber Reinforced Substrates with Multiple Layers of the MP101 Crystal Coat Resin with and then without the 0.2 Wt % Treated Pyrograf III Samples were prepared in the same manner as in example 2. Following this, the samples were coated with a second coat, this time in a similar manner to example 1.

Example 4

Fabrication and Testing of CIGS (Copper Indium Gallium Diselenide)-Based TFPV Devices on Substrates Prepared from Example 1

Molybdenum was sputtered onto the substrate prepared in Example 1 to form an approximately 0.5 micrometer thick layer of molybdenum. Copper, indium and gallium were co-evaporated onto the layer of molybdenum in a selenium atmosphere at a deposition substrate temperature of about 575° C. for 20 minutes to form a CIS-based solar absorber layer of a thickness of around two micrometer thick. CdS was then deposited on the CIS-based solar absorber layer through a wet CBD bath process to form a window layer having a thickness of about 50 nm. A ZnO electrically insulating layer and an ITO top contact layer were sputtered onto the window layer and then nickel-silver grids were evaporated onto the top contact layer. The cell performance was tested under AM1.5 illumination condition and an efficiency of 1 to 2% was measured.

Example 5

Fabrication and Testing of CIGS (Copper Indium Gallium Diselenide)-Based TFPV Devices on Film Prepared from Example 2

CIGS-based photovoltaic devices were fabricated in the same way as described in Example 4 on substrates prepared in Example 2. The CIGS-based TFPV devices were tested under the same conditions as shown in Example 4. An efficiency of 6 to 9% was measured.

Example 6

Fabrication and Testing of CIGS (Copper Indium Gallium Diselenide)-Based TFPV Devices on Film Prepared from Example 3

CIGS-based TFPV devices were fabricated in the same way as described in Example 4 on substrates prepared in Example 3. The CIGS-based TFPV devices were tested under the same conditions as shown in Example 4. Efficiencies up to 12.7% were measured.

Example 7

Substrate Including Stainless Steel Foil Layer and Silicone Layer Formed from Dow Corning FOX Resin A Dow Corning 9-5101 Hydrogen Silsesquioxane resin was applied onto a 6"×6" stainless steel foil layer on a spin coater at 2000 rpm for 30 seconds. The stainless steel foil layer was 25 micrometer thick 430 stainless steel and is available from Marubeni Corporation of Tokyo, Japan. The resin on the stainless steel foil layer was cured in an air circulating oven at 200° C. for 2 hours to form a silicone layer on the foil layer. The thickness of the silicone layer was approximately 1 micrometer.

Example 8

Substrate Including Stainless Steel Foil Layer and Silicone Layer Formed from Hydrogenpolysiloxane Resin A hydrogenpolysiloxane resin was prepared by cohydrolyzing trichlorosilane and dichlorosilane, washing, and condensing the hydrolyzate to yield a resin with an average composition of $(H_2SiO_{2/2})_{0.29}(HSiO_{3/2})_{0.71}$. The resin was applied onto the stainless steel foil layer as described in Example 7. The resin on the stainless steel foil layer was cured in an air circulating oven at 200° C. for 2 hours to form a silicone layer on the foil layer.

Example 9

Fabrication and Performance of CIGS (Copper Indium Gallium Diselenide) Photovoltaic Device Including the Substrate Prepared in Example 7

Molybdenum was sputtered onto the substrate prepared in Example 7 to form an approximately 0.5 micrometer thick layer of molybdenum. Copper, indium and gallium were co-evaporated onto the layer of molybdenum in a selenium atmosphere to form a CIS-based solar absorber layer of a thickness of about two micrometers. CdS was then deposited onto the CIS-based solar absorber layer through a wet CBD bath process to form a window layer having a thickness of about 50 nm. ITO was RF sputtered onto the window layer to form a top contact layer, and then copper grids were evaporated onto the top contact layer. The cell performance was tested under AM1.5 illumination condition and an efficiency of 5 to 7% was measured.

Example 10

Fabrication and Testing of CIS-Based Photovoltaic Device Including Substrate Prepared in Example 8

A CIS-based photovoltaic device was fabricated in the same way as described in Example 9 including the substrate prepared in Example 8. The CIS-based photovoltaic devices were tested under the same conditions as shown in Example 9. An efficiency of 6 to 14% was measured.

Example 11

Coating Stainless Steel Foil with Methyl $T^{ME}/SiO_{4/2}$ Resin

MP101 Crystal Coat Resin was obtained from SDC Coating Technologies, Inc. The resin was 31 wt. %. Stainless steel foil was coated and the coating was cured in the same way as described in Example 7.

Example 12

Fabrication and Testing of CIS-Based Photovoltaic Device on Coated Stainless Steel Foil Prepared in Example 11

A CIS-based photovoltaic device was fabricated in the same way as described in Example 9 on the coated stainless steel foil prepared in Example 11. They were tested under the same conditions as shown in Example 9. An efficiency of 6 to 11% was measured.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A photovoltaic device, comprising:
a reinforced substrate, including:
    a polymer base material, and
    nano-filler disposed within the polymer base material, the reinforced substrate presenting a surface in a condition that is made ready for deposition of thin film layers of the photovoltaic device;
a back contact layer formed on the surface of the reinforced substrate;
a solar absorber layer formed on the back contact layer; and
at least one of:
    a window layer formed on the solar absorber layer,
    an interface layer disposed between the back contact layer and the reinforced substrate, and
    a stress relief layer formed on a surface of the reinforced substrate opposite to the back contact layer;
wherein the polymer base material comprises a silicone composition, the silicone composition comprising:
    (A) a silicone resin having silicon-bonded alkenyl groups or silicon-bonded hydrogen,
    (B) an organosilicon compound having an average of at least two silicon bonded hydrogen atoms or silicon-bonded alkenyl groups per molecule, and present in an amount sufficient to cure said silicone resin, and
    (C) a catalytic amount of a hydrosilylation catalyst.

2. A thin film photovoltaic device, comprising:
a reinforced substrate, including:
    a polymer base material, and
    a reinforcing structure bonded with the polymer base material to present the reinforced substrate, the reinforcing structure including a structure selected from the group consisting of nano-filler, metal foil, and a fiber reinforcing structure; and
a plurality of thin film layers formed on a surface of the reinforced substrate, the plurality of thin film layers including:
    a back contact layer formed on the surface of the reinforced substrate, and
    a solar absorber layer formed on the back contact layer, the solar absorber layer including three sub layers collectively forming a p-i-n structure;
wherein the polymer base material comprises a silicone composition, the silicone composition comprising:
    (A) a silicone resin having silicon-bonded alkenyl groups or silicon-bonded hydrogen,
    (B) an organosilicon compound having an average of at least two silicon-bonded hydrogen atoms or silicon-bonded alkenyl groups per molecule, and present in an amount sufficient to cure said silicone resin, and
    (C) a catalytic amount of a hydrosilylation catalyst.

3. The thin film photovoltaic device of claim 2, further comprising
a stress relief layer formed on a surface of the reinforced substrate opposite of the back contact layer.

4. A thin film photovoltaic device, comprising:
a reinforced substrate, including:
    a polymer base material, and
    a reinforcing structure bonded with the polymer base material to present the reinforced substrate, the reinforcing structure including nano-filler and metal foil;
a plurality of thin film layers formed on a surface of the reinforced substrate, the plurality of thin film layers including:
a back contact layer formed on the surface of the reinforced substrate, and
a solar absorber layer formed on the back contact layer;
a window layer formed on the solar absorber layer; and
a top contact layer formed on the window layer.

5. A thin film photovoltaic device, comprising:
a reinforced substrate, including:
    a polymer base material, and
    a reinforcing structure bonded with the polymer base material to present the reinforced substrate, the reinforcing structure including a structure selected from the group consisting of nano-filler, metal foil, and a fiber reinforcing structure; and
a plurality of thin film layers formed on a surface of the reinforced substrate, the plurality of thin film layers including:
    a back contact layer formed on the surface of the reinforced substrate, and
    a solar absorber layer formed on the back contact layer; and a back contact interface layer disposed between the back contact layer and the solar absorber layer;
wherein the polymer base material comprises a silicone composition, the silicone composition comprising:
(A) a silicone resin having silicon-bonded alkenyl groups or silicon bonded hydrogen,
(B) an organosilicon compound having an average of at least two silicon-bonded hydrogen atoms or silicon-bonded alkenyl groups per molecule, and present in an amount sufficient to cure said silicone resin, and
(C) a catalytic amount of a hydrosilylation catalyst.

6. A thin film photovoltaic device, comprising:
a reinforced substrate, including:
a polymer base material, and
a reinforcing structure bonded with the polymer base material to present the reinforced substrate; and
a plurality of thin film layers formed on a surface of the reinforced substrate,
wherein the polymer base material comprises a silicone composition, and
wherein the silicone composition is a hydrosilylation-curable silicone composition comprising:
(A) a silicone resin having silicon-bonded alkenyl groups or silicon-bonded hydrogen;
(B) an organosilicon compound having an average of at least two silicon-bonded hydrogen atoms or silicon-bonded alkenyl groups per molecule, and present in an amount sufficient to cure said silicone resin; and
(C) a catalytic amount of a hydrosilylation catalyst.

7. The thin film photovoltaic device of claim 6, the silicone resin having the formula:

$(R^1R^2{}_2SiO_{1/2})_w(R^2{}_2SiO_{2/2})_x(R^2SiO_{3/2})_y(SiO_{4/2})_z$ wherein $R^1$ is a $C_1$ to $C_{10}$ hydrocarbyl group or a $C_1$ to $C_{10}$ halogen-substituted hydrocarbyl group, both free of aliphatic unsaturation; $R^2$ is $R^1$, an alkenyl group, or hydrogen; w is from 0 to 0.9; x is from 0 to 0.9; y is from 0 to 0.99; z is from 0 to 0.85; w+x+y+z=1, y+z/(w+x+y+z) is from 0.1 to 0.99, and w+x/(w+x+y+z) is from 0.01 to 0.9, provided said silicone resin has an average of at least two silicon-bonded alkenyl groups per molecule.

8. The thin film photovoltaic device of claim 7, the silicone resin being a rubber-modified silicone resin comprising the reaction product of:
(1) said silicone resin having the formula:

$(R^1R^2{}_2SiO_{1/2})_w(R^2{}_2SiO_{2/2})_x(R^2SiO_{3/2})_y(SiO_{4/2})_z$, and (2) at least one silicone rubber (D)(iii) selected from rubbers having the formula:

$R^5R^1{}_2SiO(R^1R^5SiO)_cSiR_2R^5$ and $R^1R^2{}_2SiO(R^2{}_2SiO)_dSiR^2{}_2R^1$, in the presence of the hydrosilylation catalyst, and optionally in the presence of an organic solvent, provided that:
when said silicon-bonded alkenyl groups of said silicon resin, said silicon rubber (D)(iii) has silicon-bonded hydrogen atoms, and
when said silicone resin (A) silicon-bonded hydrogen atoms, said silicon rubber (D)(iii) has silicon-bonded alkenyl groups.

9. The photovoltaic device of claim 1, wherein the reinforced substrate further includes a metal foil bonded with the polymer base material.

10. The photovoltaic device of claim 1, wherein the reinforced substrate further includes a fiber reinforcing structure bonded with the polymer base material.

11. A photovoltaic device, comprising:
a reinforced substrate, including:
a polymer base material, and
a reinforcing structure bonded with the polymer base material to present the reinforced substrate, the reinforcing structure including metal foil,
the reinforced substrate presenting a surface in a condition that is made-ready for deposition of thin film layers of the photovoltaic device;
a back contact layer formed on the surface of the reinforced substrate;
a solar absorber layer formed on the back contact layer; and
at least one of:
a window layer formed on the solar absorber layer,
an interface layer disposed between the back contact layer and the reinforced substrate, and
a stress relief layer formed on a surface of the reinforced substrate opposite to the back contact layer;
wherein the polymer base material comprises a silicone composition, the silicone composition comprising:
(A) a silicone resin having silicon-bonded alkenyl groups or silicon-bonded hydrogen,
(B) an organosilicon compound having an average of at least two silicon-bonded hydrogen atoms or silicon-bonded alkenyl groups per molecule, and present in an amount sufficient to cure said silicone resin, and
(C) a catalytic amount of a hydrosilylation catalyst.

12. A photovoltaic device, comprising:
a reinforced substrate, including:
a polymer base material, and
a reinforcing structure bonded with the polymer base material to present the reinforced substrate, the reinforcing structure including a fiber reinforcing structure,
the reinforced substrate presenting a surface in a condition that is made-ready for deposition of thin film layers of the photovoltaic device;
a back contact layer formed on the surface of the reinforced substrate;
a solar absorber layer formed on the back contact layer; and
at least one of:
a window layer formed on the solar absorber layer,
an interface layer disposed between the back contact layer and the reinforced substrate, and
a stress relief layer formed on a surface of the reinforced substrate opposite to the back contact layer;
wherein the polymer base material comprises a silicone composition, the silicone composition comprising:
(A) a silicone resin having silicon-bonded alkenyl groups or silicon-bonded hydrogen,
(B) an organosilicon compound having an average of at least two silicon-bonded hydrogen atoms or silicon-bonded alkenyl groups per molecule, and present in an amount sufficient to cure said silicone resin, and
(C) a catalytic amount of a hydrosilylation catalyst.

13. The photovoltaic device of claim 2, wherein the reinforcing structure includes nano-filler and metal foil.

14. The photovoltaic device of claim 2, wherein the reinforcing structure includes nano-filler and a fiber reinforcing structure.

15. The photovoltaic device of claim 3, wherein the reinforcing structure includes nano-filler and metal foil.

16. The photovoltaic device of claim 3, wherein the reinforcing structure includes nano-filler and a fiber reinforcing structure.

17. The photovoltaic device of claim 4, further comprising a buffer layer disposed between the top contact layer and the window layer.

18. The photovoltaic device of claim 4, wherein the reinforcing structure further includes a fiber reinforcing structure.

19. The photovoltaic device of claim 5, wherein the reinforcing structure includes nano-filler and metal foil.

20. The photovoltaic device of claim 5, wherein the reinforcing structure includes nano-filler and a fiber reinforcing structure.

21. The photovoltaic device of claim 1, wherein the solar absorber layer includes a material selected from the group consisting of a group II-VI material and a group material.

22. The photovoltaic device of claim 21, the solar absorber layer including a material selected from the group consisting of copper-indium-diselenide and an alloy of copper-indium-diselenide.

23. The photovoltaic device of claim 4, wherein the solar absorber layer includes a material selected from the group consisting of a group II-VI material and a group material.

24. The photovoltaic device of claim 23, the solar absorber layer including a material selected from the group consisting of copper-indium-diselenide and an alloy of copper-indium-diselenide.

25. The photovoltaic device of claim 5, wherein the solar absorber layer includes a material selected from the group consisting of a group II-VI material and a group material.

26. The photovoltaic device of claim 25, the solar absorber layer including a material selected from the group consisting of copper-indium-diselenide and an alloy of copper-indium-diselenide.

27. The thin film photovoltaic device of claim 5, further comprising a back contact interface layer disposed between the back contact layer and the solar absorber layer.

* * * * *